United States Patent
Yamada et al.

(10) Patent No.: US 6,331,454 B1
(45) Date of Patent: *Dec. 18, 2001

(54) ATOMIC-LEVEL ELECTRONIC NETWORK AND METHOD OF FABRICATION

(75) Inventors: Toshishige Yamada, Mountain View, CA (US); Yoshihiro Takiguchi, Tokyo (JP); Dehuan Huang, Palo Alto; Yoshihisa Yamamoto, Stanford, both of CA (US)

(73) Assignees: Board of Regents of the Leland Stanford Junior University, Palo Alto, CA (US); Research Development Corp, Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/247,884

(22) Filed: Feb. 10, 1999

(Under 37 CFR 1.47)

Related U.S. Application Data

(63) Continuation of application No. PCT/US95/14574, filed on Nov. 8, 1995, and a continuation-in-part of application No. 08/555,104, filed on Nov. 8, 1995, now abandoned, which is a continuation-in-part of application No. 08/336,852, filed on Nov. 8, 1994, now Pat. No. 5,981,316.

(51) Int. Cl.$^7$ .................................................. H01L 21/70
(52) U.S. Cl. ........................... 438/128; 438/129; 438/962
(58) Field of Search .................................... 438/128, 129, 438/962; 250/492.1, 492.2, 306, 307

(56) References Cited

U.S. PATENT DOCUMENTS

| | | | |
|---|---|---|---|
| 3,988,823 | 11/1976 | Hu | 29/577 |
| 4,122,479 | 10/1978 | Sugawara et al | 357/19 |
| 4,589,191 | 5/1986 | Green et al. | 29/572 |
| 4,987,312 | 1/1991 | Eigler | 250/492.3 |
| 5,561,300 | 10/1996 | Wada et al. | |
| 5,689,494 | * 11/1997 | Ichikawa et al. | 369/126 |
| 5,981,316 | * 11/1999 | Yamada et al. | 438/128 |

FOREIGN PATENT DOCUMENTS

| | | |
|---|---|---|
| 548905A2 | 6/1993 | (EP). |
| 588062A1 | 3/1994 | (EP). |

OTHER PUBLICATIONS

Huang et al., "Scanning Tunneling Microscope Fabrication of Atomic–Scale Memory on a Silicon Surface", *Jpn. J. Appl. Phys.* 33:L190–L193 (1994).

Lyding et al., "Nanoscale Patterning and Oxidation of H–passivated Si(100)–2x1 Surfaces with an Ultrahigh Vacuum Scanning Tunneling Microscope", *Appl. Phys. Lett.* 64(15):2010–2012 (1994).

* cited by examiner

Primary Examiner—Charles Bowers
Assistant Examiner—Keith Christiansen
(74) Attorney, Agent, or Firm—Flehr Hohbach Test Albritton & Herbert LLP

(57) ABSTRACT

An insulated lattice is prepared with a plurality of lattice oriented atoms to create a substantially planar surface having a lattice arrangement. Any unsatisfied chemical bonds are terminated along the substantially planar surface by placing atoms at the site of the unsatisfied chemical bonds to terminate the unsatisfied chemical bonds and insulate the surface to form a platform. In one aspect of the invention, the insulator atoms are removed at predetermined locations. Atoms to form the atomic chain are placed at predetermined locations on the insulated lattice platform to form a first atomic chain which behaves as one of a conductor, a semiconductor and an insulator. A second atomic chain is also placed at predetermined locations on the insulated lattice platform so that the second chain behaves as another of a conductor, a semiconductor and an insulator. These placements are made such that the second atomic chain is electrically coupled to the first atomic chain, and the second atomic chain behaves differently than the first atomic chain. That is, in the first chain the atoms are placed at a first separation distance and in the second chain the atoms are placed at a second separation distance, where the second separation distance is different than the first.

23 Claims, 20 Drawing Sheets

1D ATOMIC CHAIN

2D SQUARE ARRAY

PARALLEL CHAINS

CATION ANION $d = d_{in} + d_{out}$

1D ALTERNATING CHAIN

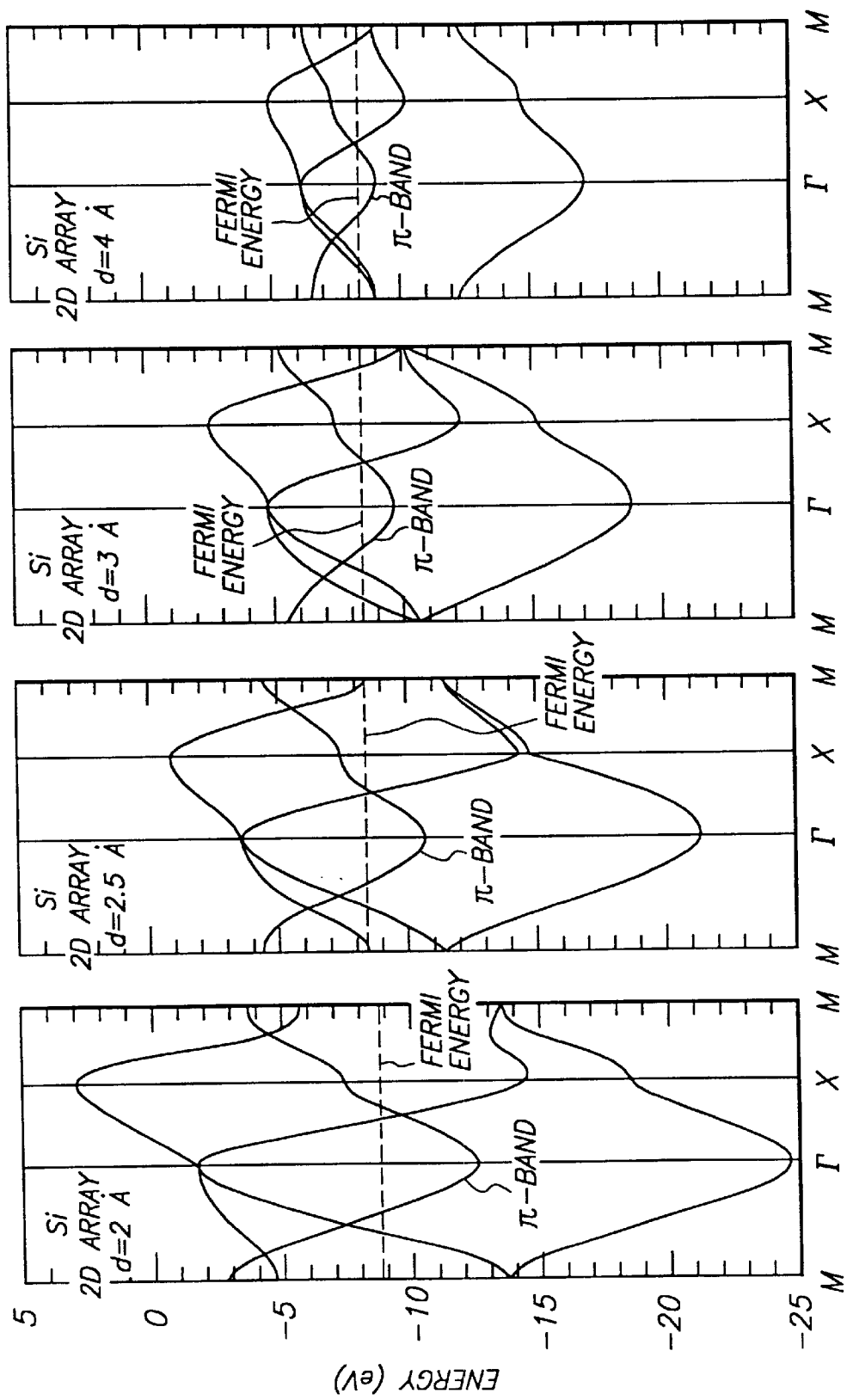

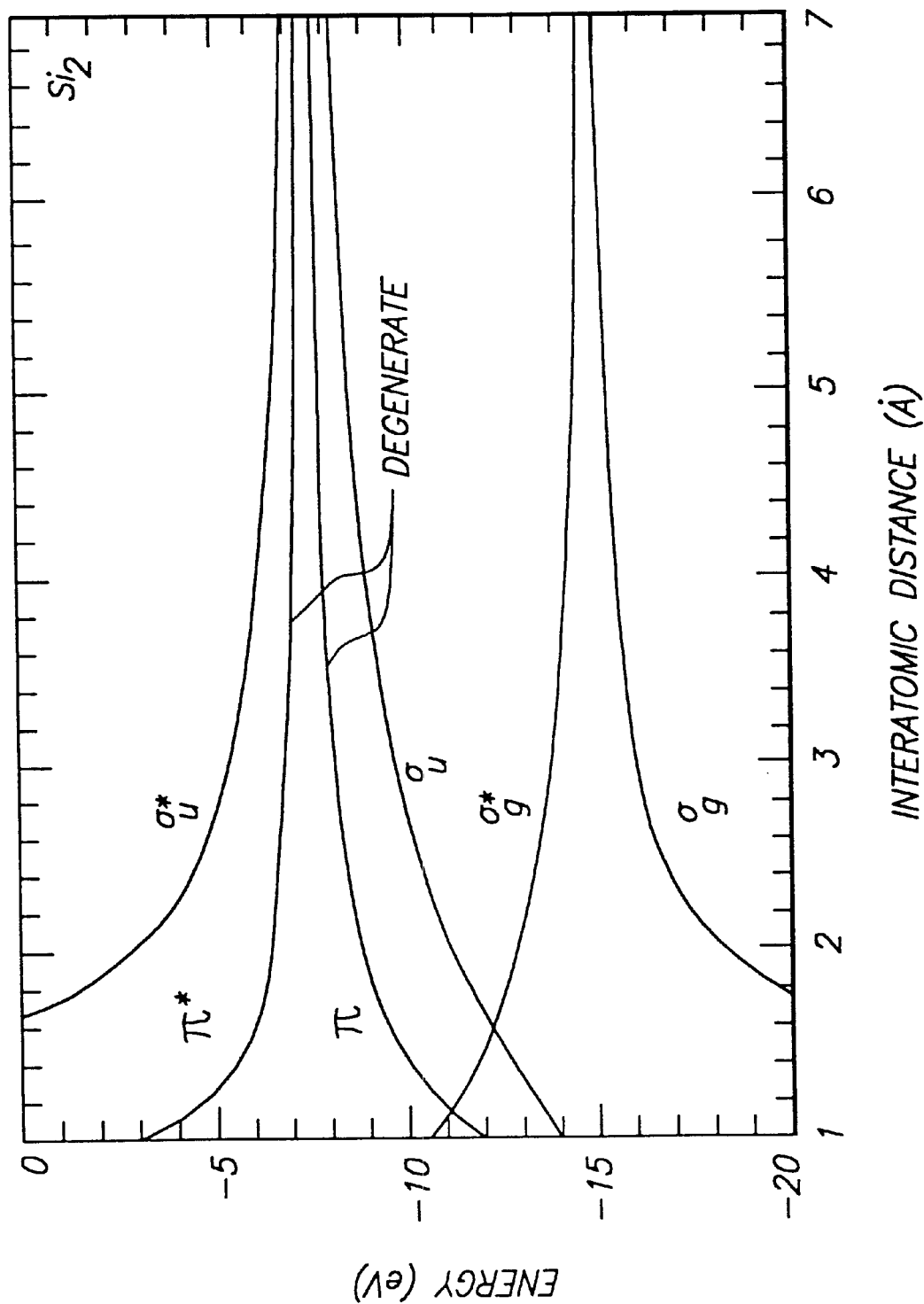

ATOMIC-LEVEL ELECTRONIC NETWORK AND METHOD OF FABRICATION

RELATED APPLICATIONS

This is a continuation-in-part of U.S. Ser. No. 08/555,104 filed Nov. 8, 1995 now abn, which is a continuation-in-part of U.S. Ser. No. 08/336,852 filed Nov. 8, 1994 now U.S. Pat. No. 5,981,316; and is a continuation of PCT/US95/14574 filed Nov. 8, 1995.

FIELD OF THE INVENTION

The present invention relates generally to a method of making an atomic-level electronic network. In particular, it relates to a circuit having a chain or array of atoms with distinct electrical characteristics related to the atomic spacing between the circuit atoms.

BACKGROUND OF THE INVENTION

In a conventional circuit network based on semiconductor device technology, functional devices made of semiconductors or insulators are connected together by relatively large metal traces designed to carry electrical signals. These structures typically require real estate on the order of tens of square micrometers, and more.

Mesoscopic structures are smaller, but still require significant real estate. To fabricate such a circuit network on a silicon substrate, diodes or transistors based on p-n junctions, or resistors made of doped semiconductors are connected by several ten nanometer wide metal lines deposited on the substrate, power is fed from a battery or an external generator, and a large ground plane is made by deposition of metal on the substrate which may be connected to the main ground. The resulting structure quickly becomes complicated and can typically require real estate on the order of hundreds of square nanometers, and more.

If the circuit network together with device elements is simply scaled down, the physical operation principle for these macroscopic devices undergoes a drastic change even at nanoscale, where the wave nature of the electrons play an important role in device operation. To further miniaturize the structures, a new device principle must be developed, adopting the atomic nature of constituent atoms forming the device.

The state of the art of the invention includes techniques for manipulating atoms such as that described in Eigler, U.S. Pat. No. 4,987,312. Eigler describes using a scanning tunneling microscope (STM) to attract atoms to an electrically charged probe tip and to move the atoms to a desired location. With regard to the substrate surface, the reference J. Lyding et al., "Nanoscale Patterning and Oxidation of H-passivated Si(100)-2×1 Surfaces with an Ultrahigh Vacuum Scanning Tunneling Microscope," Appl. Phys. Lett. vol. 64 (1994), describes a technique for making a passivated substrate without dangling tools. The technique uses ultrahigh vacuum conditions and an ATM to H-passivate an Si surface. Such an insulated surface is one that can be used in the invention. Additionally, other references such as D. Huang et al., "Physical Mechanism of Hydrogen Deposition from a Scanning Tunneling Microscopy Tip," Appl. Phys. A vol. 64 (1997) describe removing atoms from the passivated substrate at specified locations using an STM.

OBJECTS AND SUMMARY OF THE INVENTION

The present invention provides a method for making an atomic-level electronic network. An object of the invention is to provide a circuit that utilizes a minimum amount of real estate. A related object is to position and couple individual atoms on an insulated lattice to form an atomic chain or array. A related object is to position a plurality of chains or arrays on an insulated lattice and couple the chains or arrays together to form an atomic chain circuit network.

An insulated lattice is prepared with a plurality of lattice oriented atoms to create a substantially planar surface having a lattice arrangement. Any unsatisfied chemical bonds are terminated along the substantially planar surface by placing atoms at the site of the unsatisfied chemical bonds to terminate the unsatisfied chemical bonds and insulate the surface to form an insulated lattice platform. In one aspect of the invention, the insulator atoms are removed at predetermined locations.

Atoms to form the atomic chain are placed at predetermined locations on the insulated lattice platform to form a first atomic chain which behaves as one of a conductor, a semiconductor and an insulator. A second atomic chain is also placed at predetermined locations on the insulated lattice platform so that the second chain behaves as another of a conductor, a semiconductor and an insulator. These placements are made such that the second atomic chain is electrically coupled to the first atomic chain, and the second atomic chain behaves differently than the first atomic chain. That is, in the first chain the atoms are placed at a first separation distance to achieve the desired electrical characteristic and in the second chain the atoms are placed at a second separation distance to achieve the desired electrical characteristic, where the second separation distance is different than the first.

Other features and advantages of the invention will appear from the following description in which a preferred embodiment has been set forth in detail, in conjunction with the accompanying figures.

BRIEF DESCRIPTION OF THE FIGURES

Additional objects and features of the invention will be more readily apparent from the following detailed description and appended claims when taken in conjunction with the figures, in which:

FIGS. 5(a)–(d) depict dispersion (energy-momentum) of a 2D Si array for lattice constants 2 Å, 2.5 Å, 3 Å and 4 Å;

FIG. 6 depicts band structure of a parallel $Si_2$ molecule as a function of interatomic distance;

DESCRIPTION OF THE PREFERRED EMBODIMENTS

Figure 1A:
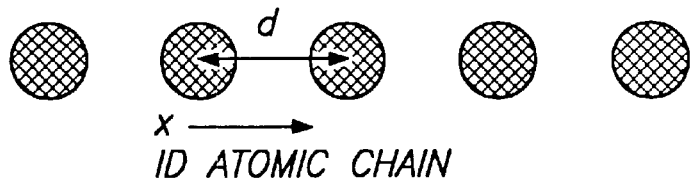
FIG. 1(a) depicts a 1 dimension (1D) atomic chain.

Preferred embodiments are directed toward making an atomic chain or array circuit network. The detailed description is organized to describe the general aspects of the invention and then the specific aspects of the invention along with specific configurations and applications. While the invention is disclosed with respect to specific embodiments, those skilled in the art will recognize that various modifications can be made while remaining within the scope of the claims.

1. Introduction

The present invention is directed at an atomic-scale circuit network, which is considered the smallest possible technology with the smallest possible element—an atom. Unlike traditional concepts which construct a circuit by creating electrical and optical devices, and signal transmission lines by various metal, insulator, and semiconductor materials, the present invention proposes to use atoms with various lattice constants. These atoms can be group IVA including carbon (C), silicon (Si) and germanium (Ge); and be group IIA including beryllium (Be) and magnesium (Mg); can be a combination of atoms such as Gallium (Ga) and Arsenide (As); or can be other atoms. As discussed later, we show that it is possible to control the Fermi energy and the band structure by changing the lattice constants, and obtain metal, semiconductor, or insulator states. Based on this feature, the invention can provide atomic-scale circuits, which are much smaller than conventional circuit networks. The invention also shows that by using similar and other kinds of atoms, it is possible to create a gate, a switch, and a carrier trap.

Due to the recent progress in atom manipulation technology with STM, it is possible to move atoms one by one and arrange them as desired on a substrate using an STM tip. In one aspect to the invention, it has been experimentally observed that there are preferred sites for the atoms, and this suggests that the substrate surface provides an array of potential wells where atoms can be placed. Making use of this potential-well array, it is technologically possible to arrange atoms periodically in one dimension (1D) or two dimensions (2D) on the given substrate. When such arranged atoms are electronically isolated from the substrate surface so that no chemical bonds are formed and the neighboring-atom interaction is practically restricted to that among arranged atoms, they form 1D or 2D electron systems. In these systems, we can change the interaction strength by assigning different values for lattice constant. This can be done, for example, by placing atoms at every one, two, three, etc. potential wells, or changing the periodic directions with respect to the crystal orientation of the substrate surface. When a lattice constant is very large, the neighboring-atom interaction is so weak that electrons are confined to each atom and have discrete energy levels such that 1s, 2s, 2p, etc., as in an isolated atom. With reduction in the lattice constant, the neighboring-atom interaction will cause these states to form a band with continuous momentum along the direction in which a periodic structure is made. Since the interaction strength can be changed with changing the lattice constant, the band width and the band gap can be designed, and this will lead to band engineering for atomic structures created on the substrate.

In another aspect of the invention, an insulated surface can be manipulated with an STM to remove atoms at predetermined locations. Atom removal provides sites for depositing atoms at the predetermined locations to form the atomic circuit. In some cases, the deposited atoms will form a bond with the underlying substrate and lock in position at the predetermined locations. For example, the substrate is sapphire and the insulated surface is hydrogen (H) atoms. An STM is used to selectively remove H atoms at predetermined locations and then the STM is used to deposit Si atoms where the H atoms were removed. The Si atoms form a bond with the substrate and will not move around on the surface. That is, the surface atom to substrate bond exceeds the surface atom to surface bond and the deposited atoms will stay at the predetermined locations where they are deposited. Of course, atoms deposited on the insulated platform can be combined in a network with atoms deposited at locations where the insulating layer is removed.

The electronic states of various atomic structures consisting of adatoms of Si—one of the most important materials in current semiconductor technology—are now described in detail. Since an Si atom has four valence electrons and the highest occupied atomic level is 3p and is one-third filled, a simple periodic structure will be metallic if the periodicity simply broadens the atomic levels. This simple view is in contrast to the fact that the usual three-dimensional (3D) Si crystal is insulating. This is because the lattice constant is so short that there are crossings of band edges, and a new gap is opened, resulting in the existence of a fully filled highest band; each Si atom is symmetrically surrounded by four neighboring-atoms and four covalent σ-bonds per atom pair corresponding to four filled valence bands. The number of atoms per unit cell is two, not one, and the problem of accommodating four valence electrons in four states is changed to accommodating eight valence electrons in eight modified states, with all bonding states fully filled. For engineering applications, it is important to have semiconducting or insulating elements since they are useful to create junctions such as metal-semiconductor or metal-insulator-metal that will exhibit nonlinear current-voltage (I–V) characteristics.

Figure 1B:
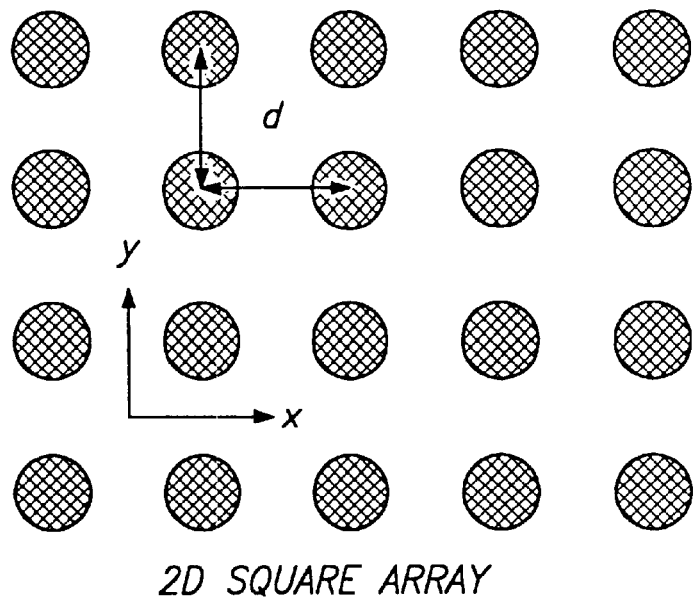
FIG. 1(b) depicts a 2 dimension (2D) atomic array.
Figure 1C:
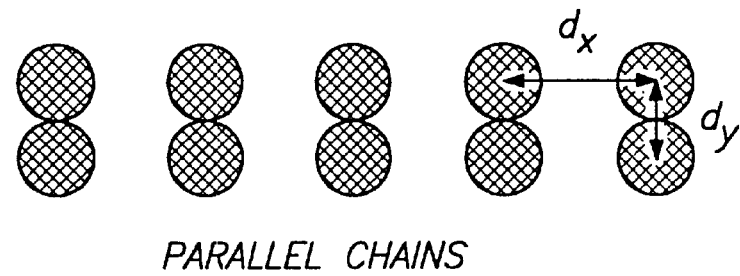
FIG. 1(c) depicts a parallel atomis chain.

Various configurations of atomic chains and arrays are shown in FIGS. 1(a)–(d). Accordingly, we will describe a 1D Si atomic chain (the simplest periodic structure) as shown in FIG. 1(a), a 2D square Si array (four nearest neighbors) as shown in FIG. 1(b), and Si parallel chains where two 1D Si chains are placed in parallel (two atoms per unit cell) as shown in FIG. 1(c). We first describe a cellular binding method and then describe a tight-binding method with universal parameters to calculate the band structures of these structures. It turns out that all the Si configurations are metallic for practically possible lattice constant values, because the Fermi energy lies in the π-band originated from 3p orbitals perpendicular to the structure, as shown below. Since the Fermi energy is far above the only band gap, the modification of the band gap with lattice constant cannot be reflected effectively in the electronic properties.

Figure 1D:
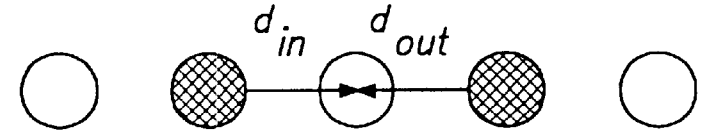
FIG. 1(d) depicts a 1D alternating atomic chain.

A 1D alternating GaAs chain is described to seek further alternatives for an insulator, where a unit cell has two genuinely different atoms as shown in FIG. 1(d). Eight valence electrons are accommodated in eight modified bands, and this is reminiscent of the 3D GaAs crystal case. However, it turns out that the GaAs chain is also metallic. The Fermi level lies within the As-originated π-bands, and the existence of the π-bands causes the GaAs chain to be metallic, as in the case of an Si chain.

Group II elements like Mg or Be can also be configured in a chain, array and parallel chains as shown in FIGS. 1(a)–(c). These group II structures can become insulating in principle. This is because s orbitals are fully filled and p orbitals are empty in these atoms, leading to the formation of the valence and conduction bands separated by a band gap even in the simple periodic atomic structures. The electronic properties are quite sensitive to this band gap, ranging from a few eV to zero as the lattice constant is reduced. Due to the wide range of possible band gap values, a 1D Mg chain will show a wide variety of electronic properties. The null band gap is realized for one lattice constant $d_0$=4.2 Å, which the chain is metallic. The chain is semiconducting near $d_0$, but either greater or less, and is insulating if far from $d_0$. This means that an insulator, a semiconductor, or a metal can be realized by manipulating the lattice constant. We have again a situation that Mg atomic structures are mostly insulating although the usual 3D Mg crystal with the hexagonal close-packed structure is metallic, and this can be attributed to the difference in the effects of three, rather than one, dimension. A 2D Mg square array is further described and is shown to have an insulating phase for d>5.2 Å and a metallic phase for d<5.2 Å. This property is highly useful since it is a permits various types of electronic circuits to be constructed with a single kind of atoms.

2. A Model Atomic Chain

A cellular method can used to determine an energy band structure. The cellular method is excellent in providing an intuitive physical picture and is fairly quantitatively accurate. However, a tight-binding method is also used, which is calculated by digital computers and is more accurate. We first describe the cellular method and then the tight-binding method.

A. Cellular Method of Energy Band Structure Prediction

In the cellular method, a wave function and its derivatives are connected at the intersection of the x axis and the cell boundary planes. A neutral isolated Si atom has fourteen electrons. Ten of them form a quite stable close-shell electron-configuration of Ne where 1s, 2s, $2p_x$, and $2p_x$ states are completely filled, and all the usual physical properties are determined by four extra electrons. Based calculations in general, including the cellular method, focus only on these electrons. Two of these extra electrons completely occupy the 3s states capable of accommodating two electrons with spin degree of freedom, and the other two occupy the 3p states capable of accommodating six electrons, thereby filling ⅓ of the allowed positions.

If an atomic chain is formed in the x direction, there is coupling between atomic states such as 3s or 3p due to the neighboring atom interaction. The 3s (with spherical symmetry), $3p_y$ (with angular dependence of y/r, where $r=(x^2+y^2+z^2)^{1/2}$, and $3p_x$ (with angular dependence of z/r) states are even under the inversion of x-axis with respect to the nuclear position, and only $3p_x$ (with angular dependence of x/r) state is odd. In this neighboring atom interaction, an even-parity state and an odd-parity state can couple in general to form a band. However, the coupling between $3p_y$ and $3p_x$, or between $3p_z$ and $3p_x$ is quite weak and negligible since $3p_y$ and $3p_z$ wave functions are zero on the x-axis where the interaction is strongest. Thus, 3s and $3p_x$ states can couple to form $sp_x$-hybrid, and $3p_y$, $3p_z$ states remain unmodified in the first approximation. Each atom is assumed to preserve an almost spherical shape in the neighborhood of the x-axis, even when the atomic chain is formed. The following example shows how the 3s and $3p_x$ states couple as the lattice constant is reduced. Since the x-axis is of great importance, a wave function along the x-axis such that Ψ(x,0,0) is considered, and is denoted as y(x) except when confusion would result.

A general solution $\Psi_1(x)$ of the Schrödinger equation inside cell 1 for given electron energy E can be formed by linear combination of an even function g(x) and an odd function u(x) with respect to the nuclear position, where x is the coordinate inside the cell with a period a ($-a/2<x<a/2$) and the origin is taken at the nuclear position. Then, $$\Psi_1(x)=Ag(x)+Bu(x) \quad (1)$$

where A and B are complex numbers, and g(x) and u(x) are calculated numerically. Once the wave function $\Psi_1$ in cell 1 is calculated, all the wave functions in other cells are determined by the Bloch theorem, which requires that the wave function $\Psi_{n+1}(x)$ in the n+1th cell be given, denoting crystal momentum by k, as $$\Psi_{n+1}(x)=\exp(inka)\Psi_1(x-na) \quad (2)$$

for $(n-½)a<x<(n+½)a$.

For an arbitrary combination of A and B, however, cell wave functions do not connect smoothly at cell boundaries. Smooth connection is possible only for special combinations, which are found by requiring that the value and the derivative of the wave functions be continuous at the center of the cell boundary (Wigner-Seitz) planes. Then, all the requirements at each cell boundary reduce to one same condition such that $$\Psi_1(a/2)=\exp(ika)\Psi_1(-a/2), \text{ and}$$

$$d\Psi(a/2)dx=\exp(ika)d\Psi(-a/2)/dx. \quad (3)$$

Next, Equation (2) is inserted into Equation (3) and using the symmetry properties such that g(−a/2)=g(a/2), g'(−a/2)=−(a/2), etc., resulting in the matrix equation:

$$[1-\exp(ika)]g(a/2)A+[1+\exp(ika)]u(a/2)B=0$$
$$[1+\exp(ika)]g'(a/2)A+[1-\exp(ika)]u'(a/2)B=0 \quad (4)$$

In order to have a non-trivial solution for A and B, the determinant of Equation (4) has to vanish, which is given by, $$\tan^2(ka/2)=-[g'(a/2)]/[g(a/2)u'(a/2)]=\sigma \quad (5)$$

The crystal momentum k as a function of E is calculated through Equation (5), and this defines the dispersion relation. The traveling wave solution is possible only when σ>0 and k is real, corresponding to an allowed energy region. When σ<0, k is generally complex and the wave decays along the chain, corresponding to a forbidden energy region.

The wave function along the chain can be constructed using the coefficients A and B that are determined by Equation (4) under the condition of Equation (5). The final form is given by $$\Psi_1(x)=(u'(a/2)u(a/2))^{1/2}g(x)-(k/|k|)(g'(a/2)g(a/2))^{1/2}u(x) \quad (6)$$

where g(x) and u(x) need not to be normalized. The wave function $\Psi_{n+1}(x)$ in the n+1th cell is calculated using Equation (2). It is noted that whenever k is real and the traveling solution is possible, only one of g(a/2), g'(a/2), u(a/2), and u'(a/2) has a different sign and the remaining three have the same sign, and therefore, one of the coefficients is real and the other is pure imaginary in Equation (6). Thus, the amplitude of the wave function is symmetric within a cell for the nuclear position and periodic from cell to cell for an allowed energy state.

This method is applied to the present problem of an Si atomic chain, where 3s and $3p_x$ wave functions on the x-axis correspond to even and odd functions g(x) and u(x), respectively. The radial part R(r) of the Schrödinger equation for an electron in an isolated atom when expressed in atomic units has a form as $$(1/r^2)(dr^2/dr)(dR(r)/dr)+[E-1(1+1)/r^2-V(r)]R(r)=0 \quad (7)$$

where 1 is the angular momentum. The function V(r), a nuclear Coulomb potential including the effect of Coulomb repulsion and exchange interaction by other electrons self-consistently, is defined by $$V(r)=-z(r)/r \quad (8)$$

where the effective nuclear charge z(r)>0 is given in a numerical table by Herman and Skillman. Since z(r) represents the effects of the other 13 electrons excluding the one in consideration, it is a monotone decreasing function with the limiting values of z(0)=14 and z( )=1.

The Schrödinger equation (7) must be solved for given energy E, and g(a/2), g'(a/2), u(a/2), and u'(a/2) calculated numerically. This is done easily by introducing a new function P(r) defined by P(r)=rR(r). Then, Equation (7) is rewritten by $$d^2P(r)/dr^2+F(r)P(r)=0 \quad (9)$$

where $$F(r)=E-1(1+1)/r^2-V(r) \quad (10)$$

An appropriate initial condition has to be found to obtain 3s and $3p_x$ wave functions. Since F(r) has divergent terms when r→0, the initial condition has to be given avoiding the origin. A wave function with angular momentum 1 is characterized by the behavior around the origin by $$P(r)\sim r^{1+1} \quad (11)$$

where 1=0 corresponds to the 3s state and 1=1 to the $3p_x$ state. These values serve as an initial condition for numerical integration. Integration determines P(a/2) and P'(a/2) and they are immediately converted to R(a/2) and R'(a/2). This is done for even and odd solutions and all the necessary values g(a/2), g'(a/2), u(a/2), and u'(a/2) are determined to calculate σ for given E. Then, the dispersion relation is obtained through Equation (5) and the wave function is constructed through Equation (6). It is an energy value E that guarantees 3s or 3p wave functions. In fact, the expression in Equation (11) just describes the wave function with angular momentum 1 and may accidentally correspond to 4s, 4p, 5s, 5p, etc. functions with a different number of zeros. The careful input of E is necessary.

B. Tight-Binding Method of Energy Band Structure Prediction

The cellular method is simplified in that the wave function matches only at one point of the unit cell boundary planes (intersection of the x axis and the boundary planes), while in the present tight-binding method, the wave function matches over the entire planes as shown in detail below. Thus, all the previous solid-state analysis is simplified, especially when discussing the electronic properties apart from the x axis. This changes the conclusion for Si atomic chain, which is now shown to be metallic for all atomic spacings.

All the new results are derived from solid-state analysis solving the Schrödinger equation. Here, the electron wave function |f(x,y,z)> for 1D chain in the x-direction is written by $$|f(x,y,z)>=\Sigma\exp(iknd)[A|s(x-nd,y,z)>+B|p_x(x-nd,y,z)>+C|p_y(x-nd,y,z)>+D|p_z(x-nd,y,z)>],$$

where the summation Σ is with respect to integer n(site), |s>, $|p_x>$, $|p_y>$, $|p_z>$ are atomic s, $p_x$, $p_y$, and $p_z$ wave functions, respectively, and k is the momentum. This form automatically satisfies the Block theorem so that f(x+d,y,z)=exp(ikd)f(x,y,z). This form also automatically satisfies the requirement that the wave function and its derivative be continuous (matching) at all the points on the unit cell boundary planes, and this makes the tight-binding method much more reliable than the previous cellular method requiring the matching at only one point on boundary planes. Numerical constants A, B, C, and D are determined so that the energy expectation value ε=f|H|f>/<f|f> is minimized. Thus, this method can be classified as a variational method. In order to determine E, we need the following matrix elements, with neglect of coupling for farther than the second-nearest neighbors:

<s(x,y,z)|H|s(x,y,z)>=$\epsilon_s$,
<s(x,y,z)|H|$p_1$(x,y,z)>=0 for 1=x,y,z (by symmetry),
<$p_1$(x,y,z)|H|p1(x,y,z)>=$\epsilon_p$ for 1=x,y,z,
<$p_1$(x,y,z)|H|$p_m$(x,y,z)>=0 if m and 1 are different,
<s(x=d,y,z)|H|s(x,y,z)>=Vssσ(d), $\langle s(x=d,y,z)|H|p_x(x,y,z)\rangle = Vsp\sigma(d),$ $\langle p_x(x-d,y,z)|H|p_x(x,y,z)\rangle = Vpp\sigma(d),$ and $\langle p_1(x=d,y,z)|H|p_1(x,y,z)\rangle = Vpp\pi(d)$ for $1=y,z$, where H is a Hamiltonian for an electron. Once these quantities $\epsilon_s$, $\epsilon_p$, $Vss\sigma(d)$, $Vsp\sigma(d)$, $Vpp\sigma(d)$, and $Vpp\pi(d)$ are determined, the constants A, B, C, and D are determined by diagonalizing a 4×4 matrix, which can be done numerically.

Harrison showed that $\epsilon_s$ and $\epsilon_p$ are basically the atomic s and p energy levels with a correction of many-body effects, and are material dependent. Harrison tabulated his theoretical results in W. A. Harrison, "Coulomb Interactions in Semiconductors and Insulators," Phys. Rev. B vol. 31 p. 2121 (1984) for most kinds of atoms, including Si, Ge, Mg, Be, Ga and As. Harrison also showed that the last four matrix elements are given as a universal function of the internuclear distance d, independent of material, as shown in W. A. Harrison, "Tight-binding Method," Surf. Sci. vol. 299/300 p. 298 (1994), by the equations:

$$Vss\sigma(d) = -1.32 \text{ (eV-Å}^2\text{)}/d^2,$$

$$Vsp\sigma(d) = 2.22 \text{ (eV-Å}^2\text{)}/d^2,$$

$$Vpp\sigma(d) = 1.42 \text{ (eV-Å}^2\text{)}/d^2, \text{ and}$$

$$Vpp\pi(d) = -0.63 \text{ (eV-Å}^2\text{)}/d^2.$$

where inserting the distance d in the unit of Å gives the matrix elements in the unit of eV, which corresponds to equation 12 described below. This is the Harrison's universal parameter relation, supported by the wide variety of experiments. A, B, C, and D, and the energy expectation value $\epsilon = \langle f|H|f\rangle / \langle f|f\rangle$ are determined numerically for a given momentum k, and this defines the energy-momentum relation.

The wave function $|f(x,y,z)\rangle$ for 2D square lattice can be formed in a similar manner such that:

$$|f(x,y,z)\rangle = \Sigma \exp(ikxnd+ikymd)[A|s(x-nd,y-md,z)\rangle + B|p_x(x-nd,y-md,z)\rangle + C|p_y(x-nd,y-md,z)\rangle + D|p_z(x-nd,y-md,z)\rangle],$$

which leads to 4×4-matrix diagonalization. A similar form can be written for parallel chains with eight numerical constants, resulting in 8×8-matrix diagonalization.

Comparing the tight-binding method with the cellular method, the tight-binding wave function matches on the entire cell boundary planes such that $x=d/2$, $x=3d/2$, $x=5d/2$, etc., while the previous wave function matches only on the intersection of the x axis and the boundary planes, such that $(d/2,0,0)$, $(3d/2,0,0)$, $(5d/2,0,0)$, etc. Thus, if we describe the electronic properties apart from the x axis, the tight-binding method is always correct while the cellular method is not. Actually this difference is significant in the discussion of the π-band, which is realized in a chemical bond parallel to, but not exactly on the x-axis. The tight-binding method describes the π-band correctly, while the previous method cannot. In the new results, an Si atomic chain is metallic due to the existence of the π-band and this result is reliable only if derived with the tight-binding method.

3. Silicon Structures

We use tight-binding theory with universal parameters to calculate band structures of various structures. This method may not be as accurate as ab initio methods, but it provides a clear physical picture, which is more to the point. We need to design the band structure, e.g., we often need to know how to change the lattice structure to widen or raise a band of interest. The tight-binding theory with universal parameters provides a clear intuitive answer, and is most suitable for the present purposes. In the application of the theory, how the matrix elements coupling s-states and p-states on neighboring-atoms change with interatomic distance d is crucial. The matrix element connecting an 1-state and an 1'-state (1, 1'=s,p) with m-bond (m=σ,π), angular momentum around the internuclear axis, is expressed by $$V_{ll'm} = \eta_{ll'm}(h^2/\mu d^2) \tag{12}$$

where h is the reduced Planck constant, $\mu$ is the electron vacuum mass, and d is the interatomic distance. The $\eta_{ll'm}$ are universal dimensionless constants and all the necessary values are tabulated in W. A. Harrison, "New Tight-binding Parameters for Covalent Solids Obtained Using Louie Peripheral States," Phys. Rev. B. vol. 24 p. 5835 (1981). It has been found that the electronic structures of sp-bonded materials are described well by equation (12) as described in W. A. Harrison, "Tight-binding Method," Surf. Sci. vol. 299/300 p. 298 (1994). This means that the relation is valid for a wide range of d, roughly corresponding to the sizes of smallest to largest atoms, from 1 Å to more than 5 Å. Thus, we use this relation throughout the present analysis. Actually, the matrix elements will drop exponentially for larger distances and therefore we may overestimate band widths for lattice constants of order or beyond 5 Å. This overestimate, however, does not change any qualitative conclusions in this embodiment. For s-state and p-state atomic energies $\epsilon_s$ and $\epsilon_p$, the Hartree-Fock term values are adopted, which are also tabulated in W. A. Harrison, "Coulomb Interactions in Semiconductors and Insulators," Phys. Rev. B vol. 31 p. 2121 (1984), and only the nearest neighbor interaction is included as usual. The resultant secular equations are solved numerically to obtain band structures.

The band calculations below are performed as if the atomic structures were floating in the vacuum, neglecting the effects from the substrate. Experimentally atomic structures have to be created on the substrate and the presence of the substrate will modify the electronic bands quantitatively, but probably not qualitatively. In 1D structures, a Peierls transition corresponding to a spontaneous distortion of the lattice to reduce the total energy by opening a gap at the expense of elastic energy, or an Anderson localization of electrons due to the random fluctuation of lattice potential could be relevant under certain situations (e.g., depending on substrate surface, lattice constant, or temperature) but are assumed not to occur here.

An Si atom has four valence electrons. Since the highest 3p state is not fully but one-third occupied, simple periodic structures will be metallic as long as periodicity just broadens the discrete atomic energy levels. This may not be the case when the upper p-like bands separate or when there is a significant mixture of 3s and 3p states. The formation of $sp^3$ hybrids in 3D Si crystal with diamond structure is an example of the second case, such that each Si atom is surrounded by four nearest neighbor atoms symmetrically. This is also true for the 2D square Si array, but we shall see that it is metallic. Another way to create an Si insulator would be to change the number of atoms, and therefore electrons per unit cell so that the highest energy band is fully occupied. Actually, 3D Si crystal has two atoms per unit cell and this doubles the number of electrons available to each band. Accordingly, we will study a 1D Si atomic chain (the simplest periodic structure), a 2D square Si array (four nearest neighbors), and Si parallel chains where two 1D atomic chains are placed in parallel (two atoms per unit cell). These structures are schematically shown in FIGS. 1(a)–(c).

In addition to the theoretical interest, it is important to find insulating atomic structures, since this will open a door to future engineering applications. In current semiconductor electronics, most electronic devices are created by forming junctions of metals, insulators (semiconductors) or a combination of them. These junctions typically exhibit nonlinear I–V characteristics, and are useful for various signal processing purposes, such as amplification or rectification. Although nothing is known about the transport properties in these atomic structures at this stage, it is beneficial to seek possible insulating atomic structures to show the potentiality of these atomic structures. If a metal and an insulator are obtained with the same atoms just by manipulating atomic structures, there is a good chance for such electronics applications (we shall see this example for 2D Mg square lattice later).

A. 1D Si atomic chain

Figure 2:
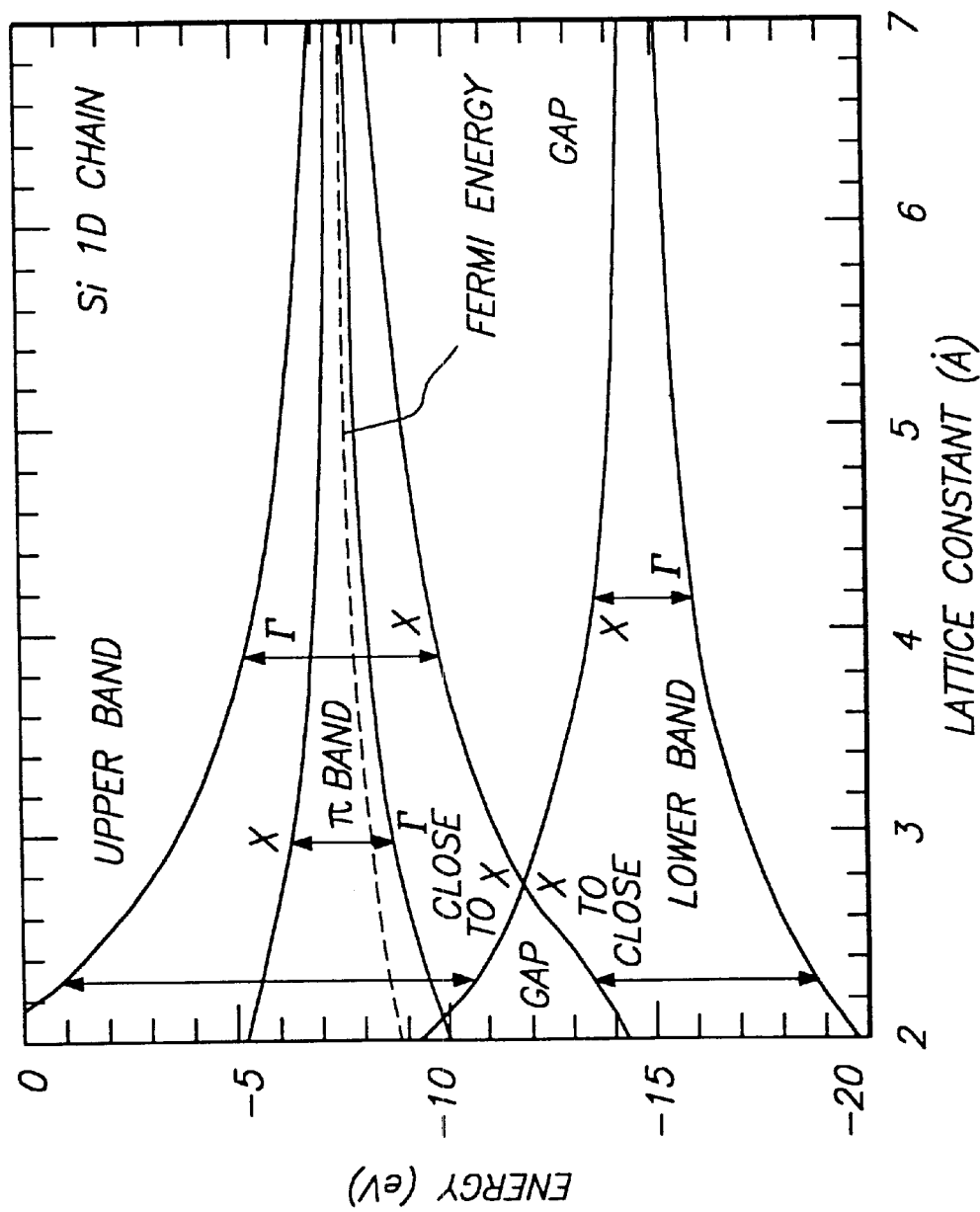
FIG. 2 depicts band structure of a 1D Si chain as a function of lattice constant, where the thick line demarcates the allowed and forbidden regions and the dotted line indicates the Fermi energy level.
Figures 3A, 3B, 3C:
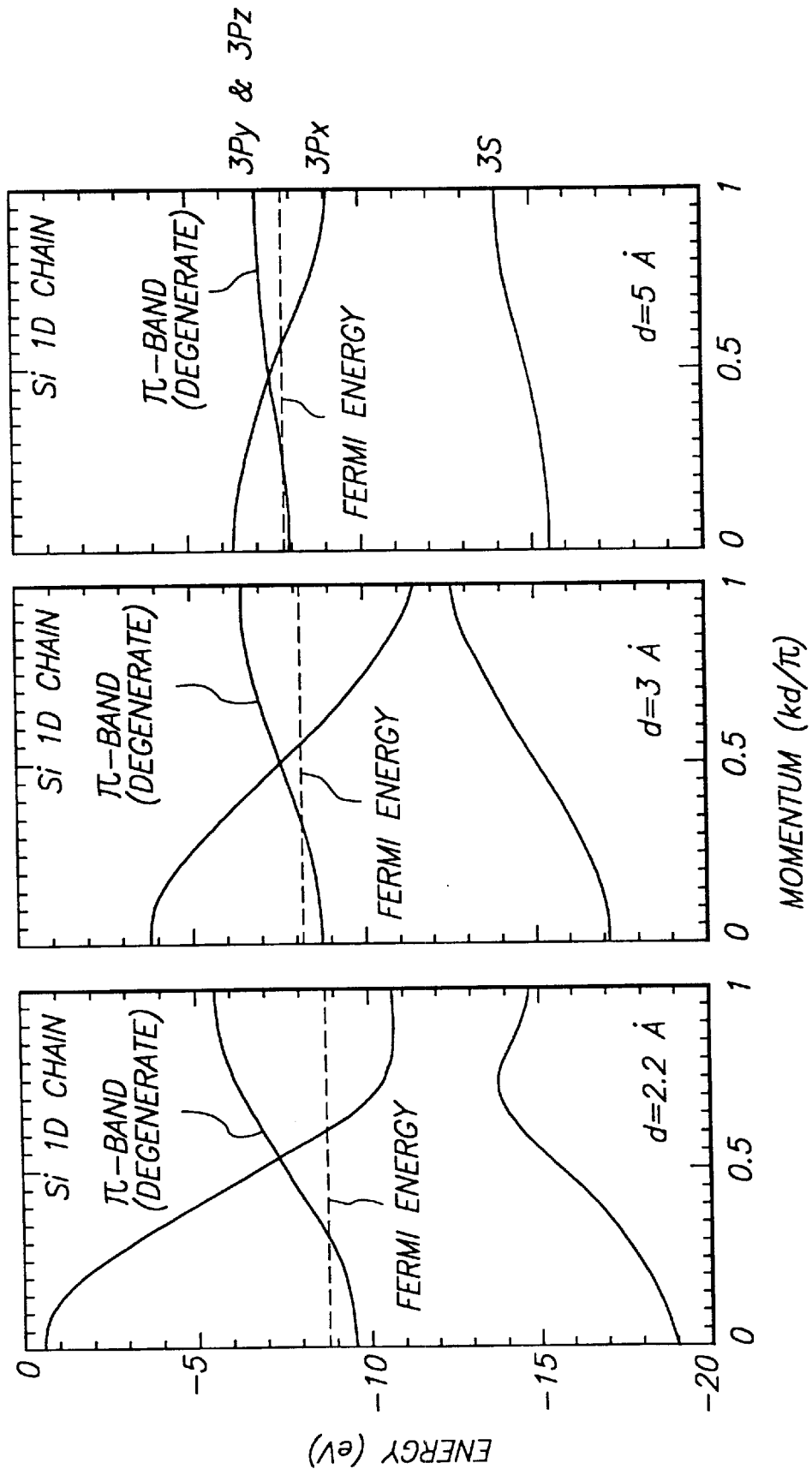
FIGS. 3(a)–(c) depict dispersion (energy-momentum) of a 1D Si chain for lattice constants 2.2 Å, 3 Å and 5 Å, where the sold lines indicate the bands originated from s and p orbital states and the dotted line indicates the Fermi energy level.

FIG. 2 shows the calculated band width of a 1D Si atomic chain as a function of lattice constant d. The chain is metallic for all lattice constants, since the Fermi energy always lies inside the doubly degenerate $\pi$-band which is originated from $3p_y$ and $3p_z$ orbitals perpendicular to the chain direction x. A crossing of the band edges occur for extremely short d such as d<2 Å, which would be unrealizable, so that the chain is consistently metallic. The lower and upper bands, outlined by thick lines, are originated from 3s and $3p_x$, and can accommodate two electrons per unit cell, respectively, while the $\pi$-bands can accommodate four electrons. There is one atom per unit cell, so four valence electrons have to be accommodated in four states and this explains the position of Fermi energy indicated by the dotted lines. Although there is a band gap between the lower and upper $\sigma$-bands, it will not be directly reflected in the electronic properties due to the high position of Fermi energy. The bottom of the lower band, the bottom of the $\pi$-band, and the top of the upper band are at $\Gamma$, while the other edges of these bands are at X for most lattice constants, as seen by the dispersion in FIGS. 3(a)–(c) for selected d. For an extremely small lattice constant of d=2.2 Å, these extremal points shifts a little away from X to the $\Gamma$ direction. The Fermi energy is indicated by a dotted line, which also shows partially filled highest bands.

B. 2D square Si array

Figure 4:
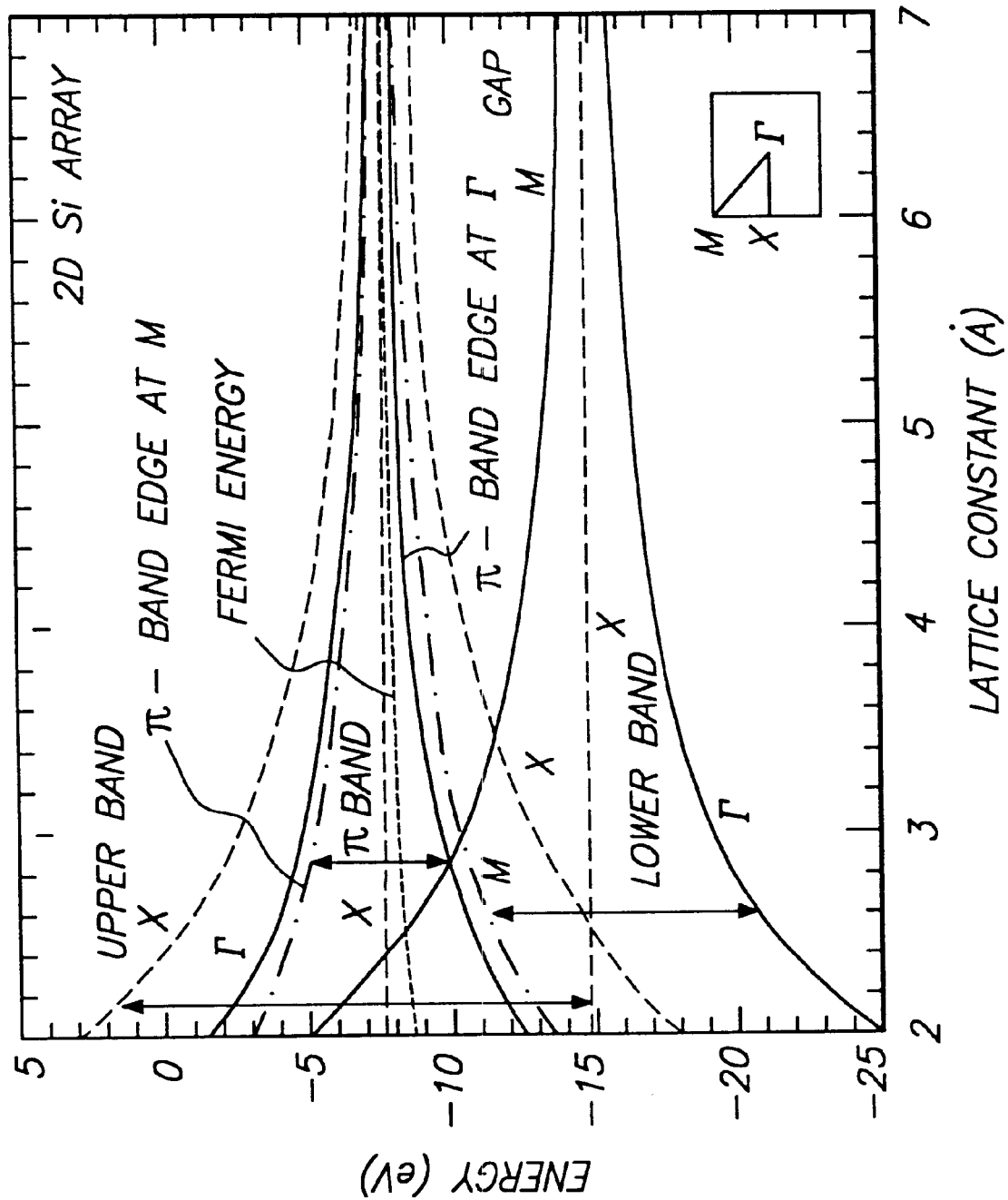
FIG. 4 depicts band structure of a 2D Si array as a function of lattice constant.

FIG. 4 shows the band width of a 2D square Si array as a function of lattice constant. The top and the bottom of the lower band are at M: k=(1,1)$\pi$/d and $\Gamma$: k=(0,0)$\pi$/d, respectively. The top and the bottom of the upper two bands are at X: k=(1,0)$\pi$/d. The bottom of the $\pi$-band is $\Gamma$ and the top is at M. For clarity, energies at $\Gamma$ (solid line), M (dashed-and-dotted line) and X (broken line) are drawn as a function of the lattice constant and the band edges are shown with the thick lines. The top of the lower band and the bottom of the upper bands change abruptly at small lattice constants where there is a crossing of two energy lines. FIGS. 5(a)–(d) are the dispersion plots for selected lattice constants. The lower $\sigma$-band and the upper two $\sigma$-bands originate from 3s, $3p_x$, and $3p_y$ orbitals, while the $\pi$-band is originated from $3p_z$ orbital, where x and y are parallel to, and z is normal to the array plane as shown in FIG. 1(b). Each of these $\sigma$-bands as well as the $\pi$-band can accommodate two electrons. We have one atom per unit cell and thus four valence electrons. The Fermi energy indicated by a dotted line is inside the $\pi$-band, and this makes the 2D Si square array always metallic. If an insulator is sought in the context of four symmetrically arranged nearest neighbors, four $\sigma$ bonds have to be created using all the 3s and 3p orbitals, as in the case of 3D Si crystal with the diamond structure. In the present square array, there is no way for $3p_z$ state to couple with 3s, $3p_x$, or $3p_y$ state on the neighboring atoms in the tight-binding sense since the matrix elements are mathematically zero due to symmetry. This creates an isolated $\pi$-band, and the Fermi energy lies inside this band. Due to the lower symmetry in addition to the existence of the $\pi$-band, it is expected that 2D Si rectangle ($d_x \neq d_y$) arrays are also metallic. This is observed for several combinations of $d_x$ and $d_y$ (figures not shown).

C. Si parallel chains

Changing the number of atoms per unit cell could allow us to realize an insulator. The structure considered here is two parallel atomic chains with the same lattice constant $d_x$, and the separation of two chains is $d_y$, as shown in FIG. 1(c). Or in other words, we first form a molecule $Si_2$ in the y-direction with the separation of $d_y$ and arrange it periodically in the x-direction with a period of $d_x$. If we can completely fill the highest occupied level of $Si_2$, then the parallel atomic chains will be a good candidate for an insulator. The molecule $Si_2$ has four $\sigma$-orbital states $\sigma_g$, $\sigma_g^*$, $\sigma_u$, and $\sigma_u^*$ originated from 3s and $3p_y$, and two doubly degenerate $\pi$-orbital states, $\pi$ and $\pi^*$ originated from $3p_x$ and $3p_z$. The states with and without * are antibonding and bonding, and g and u stand for even and odd, respectively. $\pi$ and $\pi^*$ states are degenerate, respectively, since $3p_x$ and $3p_z$ are symmetric with respect to the diatomic axis y. Each $\sigma$ state can accommodate two electrons and each $\pi$ state can accommodate four electrons including degeneracy. There are eight valence electrons and eight states in $Si_2$. For large interatomic distance $d_y$, the order in energy is $\sigma_g$, $\sigma_g^*$, $\sigma_u$, $\pi$, $\pi^*$ and $\sigma_u^*$ from the bottom. Thus, the highest occupied level is $\pi$ and is half-filled. Simple tight-binding consideration indicates that by reducing $d_y$, there is a possibility that we can realize the ordering of $\sigma_g$, $\sigma_u$, $\pi$, $\sigma_g^*$, $\pi^*$, and $\sigma_u^*$, so that the highest band is $\pi$ and is fully filled. In fact, the split of $\sigma_g$ and $\sigma_g^*$, or the split of $\sigma_u$ and $\sigma_u^*$ are due to the coupling of $V_{ss\sigma}$ (s-s coupling for $\sigma$-bond) and $V_{sp\sigma}$ (s-p coupling for $\sigma$-bond), and are much larger at small spacings $d_y$ than that of $\pi$ and $\pi^*$ which is due to $V_{pp\pi}$ (p-p coupling for $\pi$-bond).

Figures 7A, 7B, 7C:
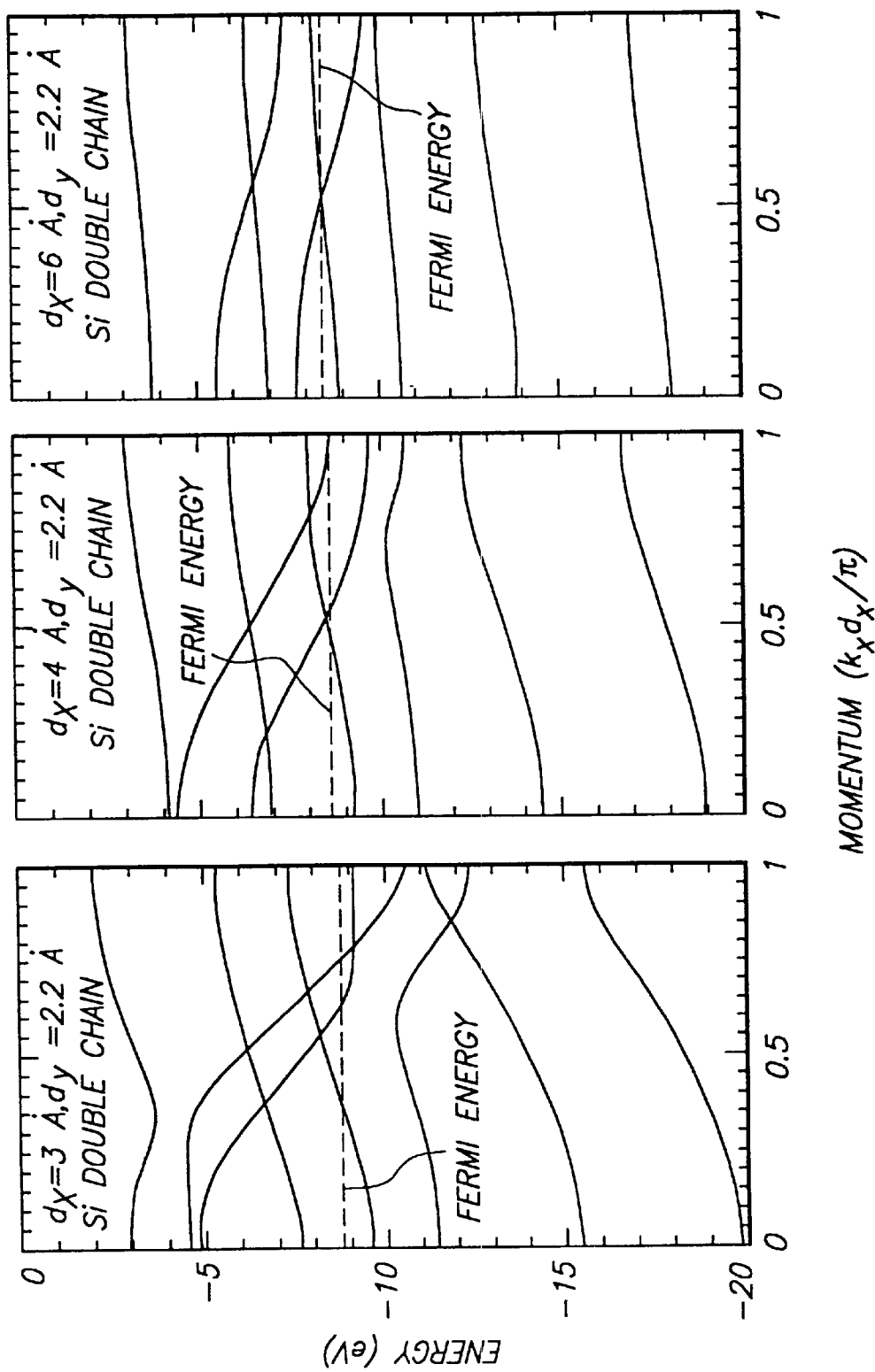
FIGS. 7(a)–(c) depict dispersion (energy-momentum) of a parallel $Si_2$ chain for interatomic distances $d_x$=3 Å $d_y$=2.2 Å, $d_x$=Å $d_y$=2.2 Å and $d_x$=6 Å $d_y$=2.2 Å.

FIG. 6 shows energy levels of $Si_2$ as a function of interatomic distance $d_y$. The tight-binding method is sometimes inaccurate in predicting the ordering of molecular energy levels in diatomic molecules, but gives the correct ordering for the present $Si_2$ case. FIG. 6 shows that the ordering of $\sigma_g$, $\sigma_u$, $\pi$, $\sigma_g^*$, and $\pi_u^*$ needed for an insulator occurs at an extremely short $d_y$ around 1.2 Å. This is much shorter than the natural interatomic distance of 2.2 521 for $Si_2$ or crystalline spacing of 2.35 Å and seems to be not practically realizable. However, this ordering is known to occur in the molecule $C_2$ and the same idea can be pursued for C atomic structures to form an insulator. In case of Si parallel chains, the structure is always metallic because the highest occupied band in $Si_2$ in partially filled. This is confirmed in FIGS. 7(a)–7(c), where the dispersion plots are shown for some $d_x$ values with $d_y$ fixed at 2.2 Å. The band structure is understood in connection with that in FIGS. 3(a)–(c). The discrete molecular levels of $\sigma_g$, $\sigma_g^*$, $\pi$, $\pi^*$, and $\sigma_u^*$ broaden to form bands, totaling eight states per unit cell. The degeneracy of $\pi$ and $\pi^*$ levels are lifted since $3p_x$ and $3p_z$ are not symmetric after the parallel chains are formed in the x direction, and eight band lines appear in the figure. The Fermi energy indicated by a dotted line lies inside the $\pi$-band. Although the molecular $\pi$ level is half filled in $Si_2$, the highest occupied bands in the parallel chain are not half filled, so that the Mott transition, which causes a metal with a half-filled band in a 1D system to become an insulator due to the Coulomb interaction, is irrelevant here.

4. Gallium Arsenide Structures

All three Si atomic structures are consistently metallic. The adoption of GaAs in another embodiment for the realization of an insulator, since whatever periodic structure we form, a unit cell has two different atoms even in the simplest alternating 1D chain. Then, eight valence electrons have to be accommodated in eight bands that are controlled by the lattice constant. We may expect more effective crossings of the band edges as the lattice constant decreases due to the adoption of two different atoms, since each of them provide 3s and 3p atomic levels, and in total there are four atomic levels to manipulate. However, the chain turns out to be metallic.

Figure 8:
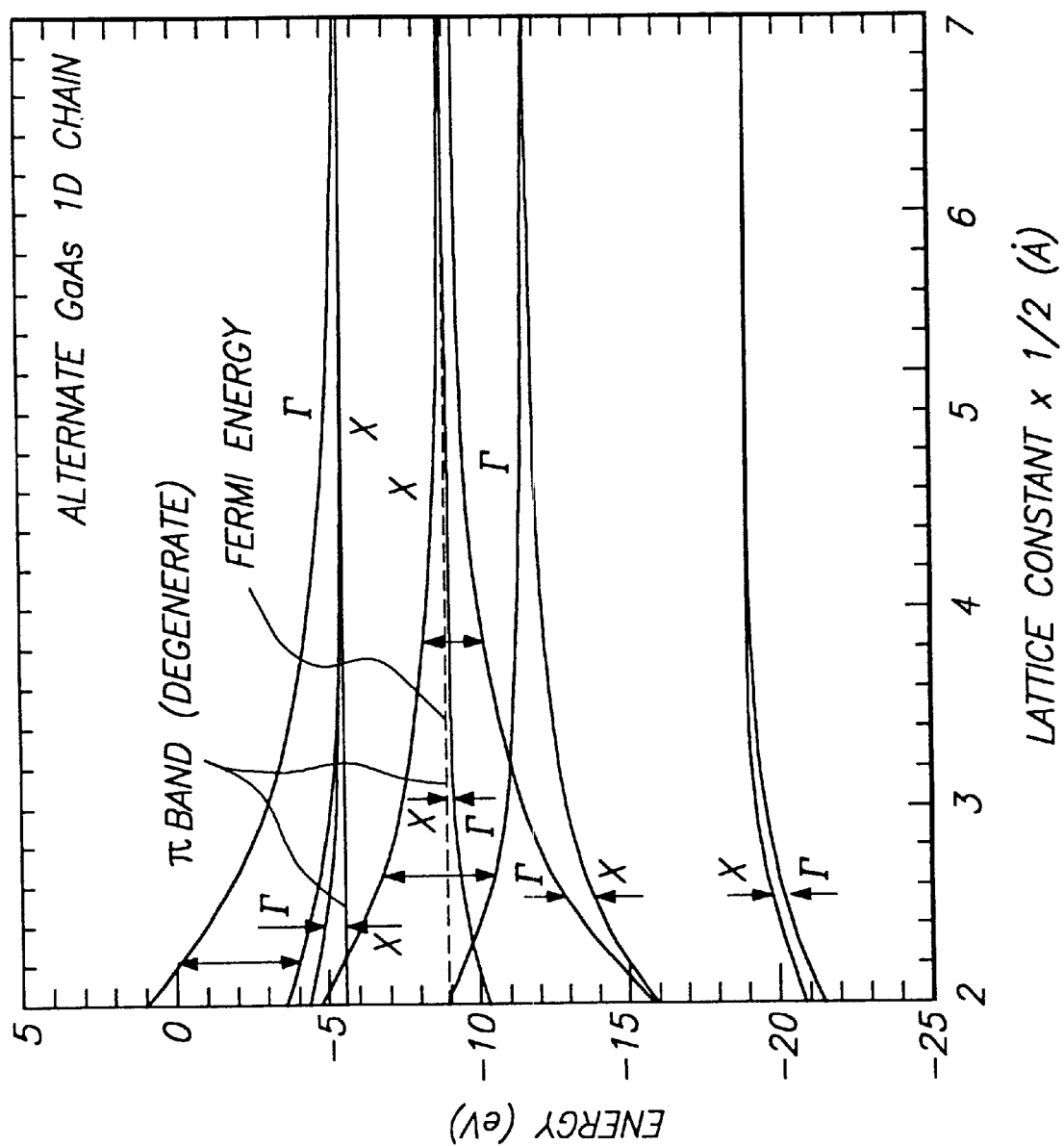
FIG. 8 depicts band structure of an alternate GaAs chain as a function of one-half lattice constant.
Figures 9A, 9B, 9C:
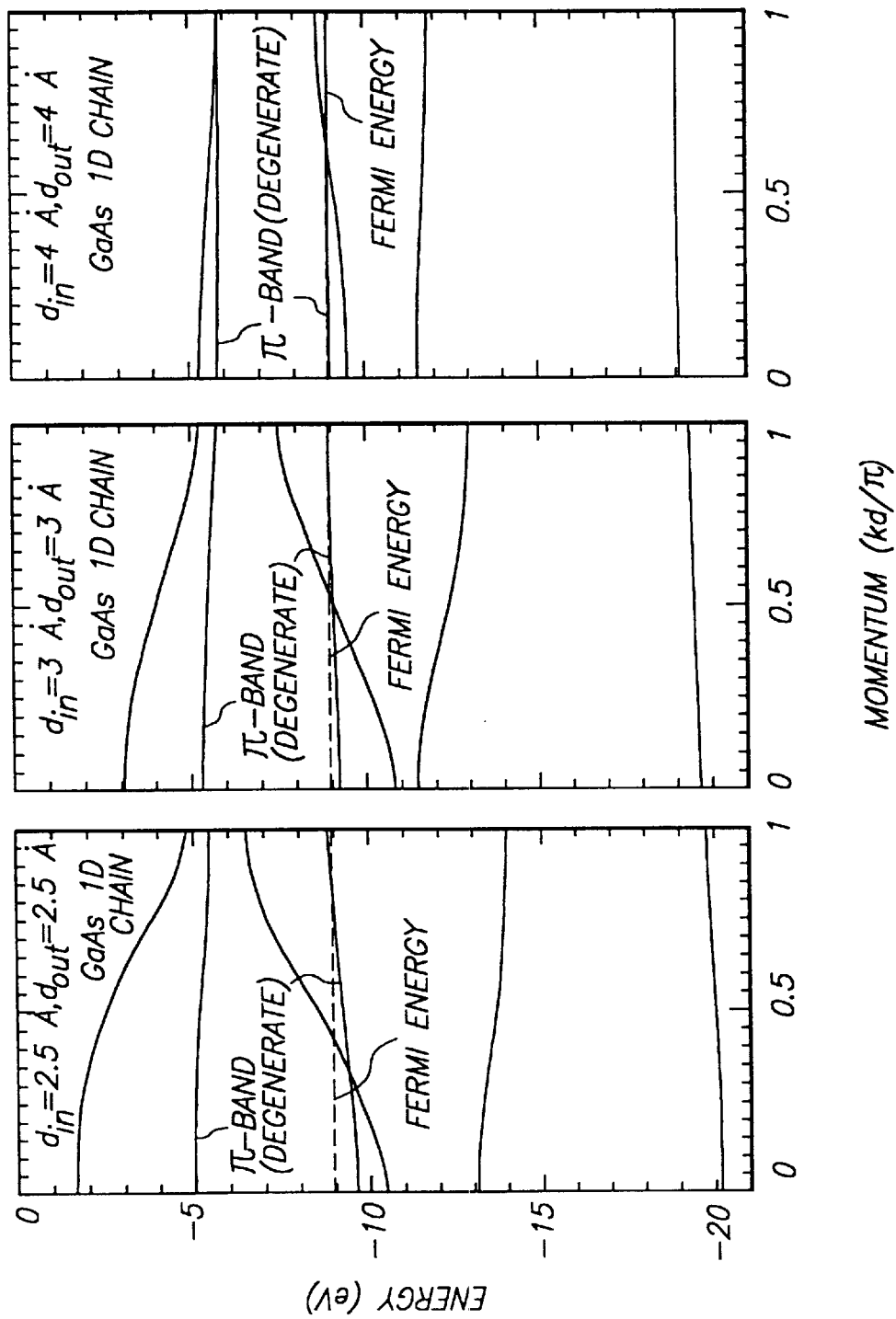
FIGS. 9(a)–(c) depict dispersion (energy-momentum) of an alternate GaAs chain for interatomic distances din=2.5 Å dout=2.5 Å, din=3 Å dout=3 Å and din=4 Å dout=4 Å.

FIG. 8 shows the band width of a 1D alternating GaAs chain, where Ga and As atoms are arranged alternating with the same interparticle distance d/2 (so that the lattice period is d). The distances $d_{in}$ and $d_{out}$ indicate the distances of Ga-As and As-Ga, respectively, as shown in FIG. 1(d), and they are set equal here. There are eight bands in total, including the degeneracy of the π-bands. In the limit of large lattice constant, and the bands originate from As 3s, Ga 3s, As 3p, Ga 3p in the increasing order of energy. In the upper four bands, the σ-bands are from $3p_x$ in the chain direction and π-bands are from $3p_y$ and $3p_z$ normal to the chain direction. Since the Fermi energy lies within the As originated π-bands and a crossing of the band edges occurs far below the Fermi energy, the chain is always metallic. This situation is even clearer in the dispersion plot in FIGS. 9(a)–(c). The adoption of different $d_{in}$ and $d_{out}$ does not change the electronic properties qualitatively. For practical lattice constants, the band edge crossing involving the Fermi electrons does not occur, and an insulator cannot be obtained. Since a 1D GaAs chain is metallic because of the existence of π-band electrons, which is the same mechanism as that of a 1D Si chain, it is expected that a 2D GaAs array and GaAs parallel chains would probably end up with being metallic as in the case of Si, and another alternative is be sought for realization of an insulator.

5. Magnesium Structures

As shown above, all three Si atomic structures and the 1D GaAs alternating chain are metallic, although the usual 3D Si or GaAs crystal is an insulator. The reasons can be stated in several different manners but the most instructive one is because there is a π-band originating from 3p orbitals normal to the structures (the chain direction or the array plane), within which the Fermi energy lies. In the 3D Si or GaAs crystal, this π-band is eliminated due to the formation of three-dimensional bands, often associated with $sp^3$ hybrid.

It is shown below the atomic structures with divalent atoms belonging to group II can be insulating under certain circumstances. The highest occupied level is valence s and is fully filled while all the valence p levels are empty. Thus, we can empty the unwanted π-band, and the band gap between the lower and upper bands formed by band edge crossings is reflected directly in the electronic properties. In order to show how insulators are formed with group II elements, a 1D Mg atomic chain and 2D Mg square array are discussed.

A. 1D Mg or Be atomic chain

Figure 10:
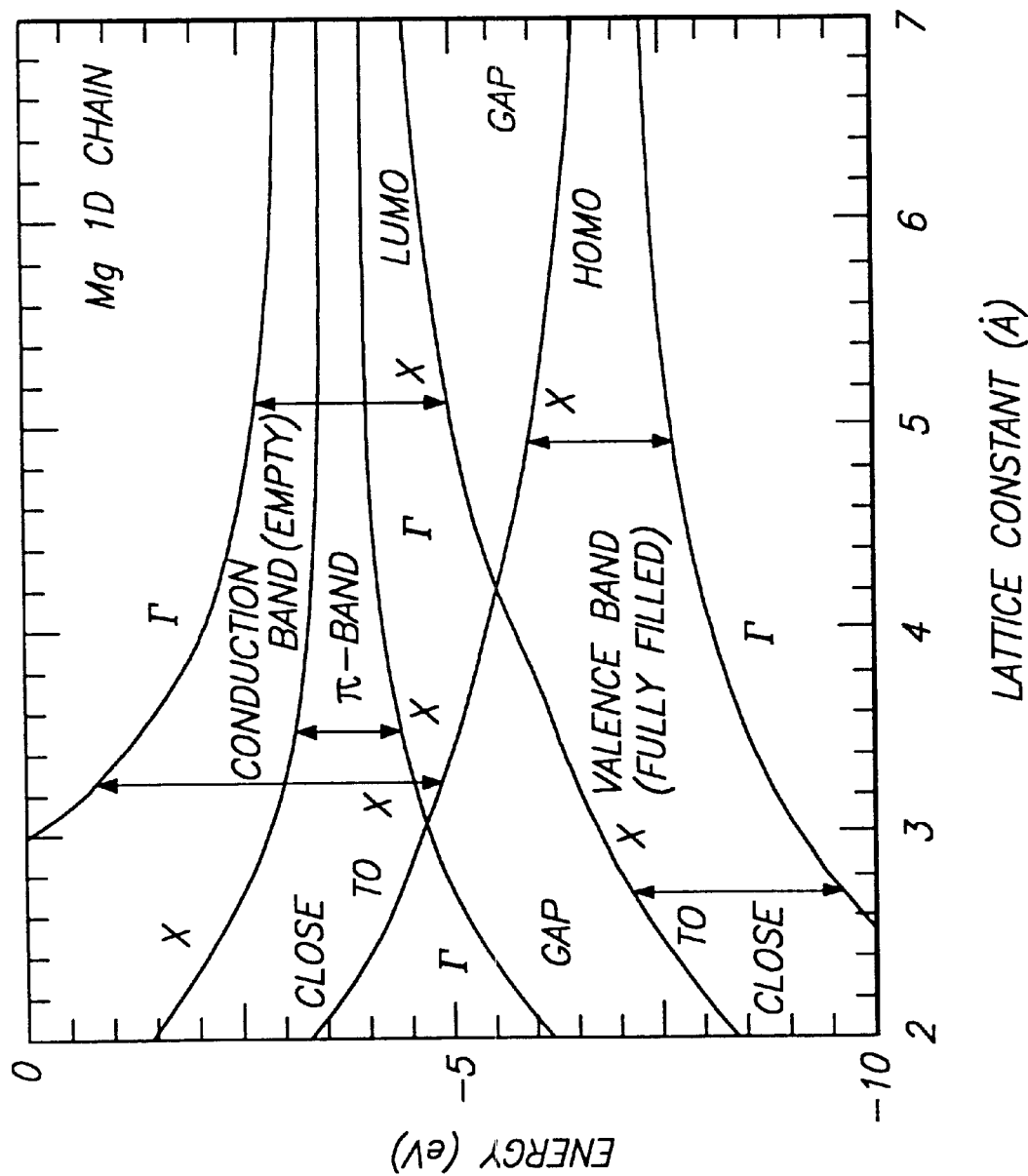
FIG. 10 depicts band structure of a 1D Mg chain as a function of lattice constant.
Figures 11A, 11B, 11C:
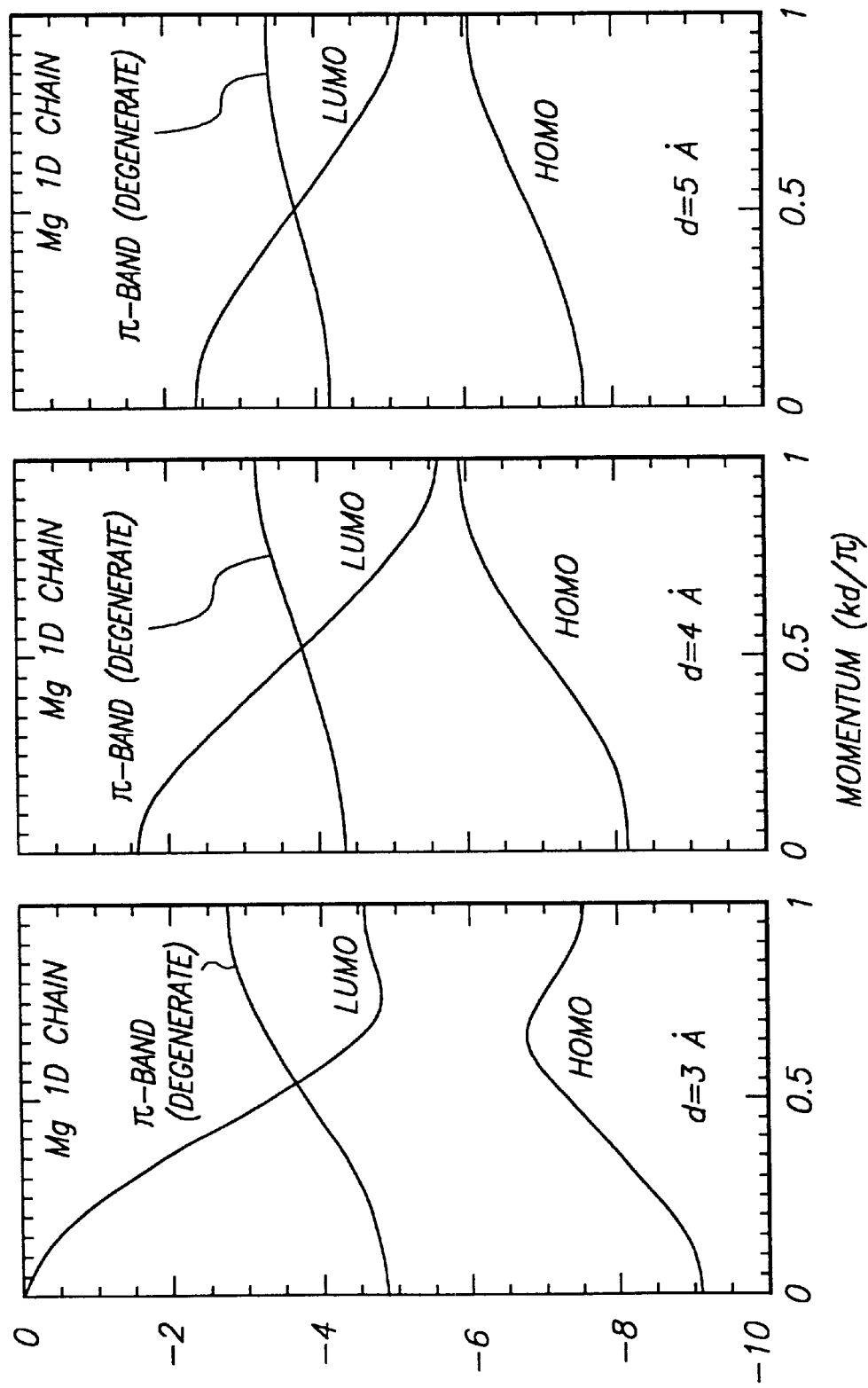
FIGS. 11(a)–(c) depict dispersion (energy-momentum) of a 1D Mg chain for lattice constants 3 Å, 4 Å and 5 Å.
Figure 12:
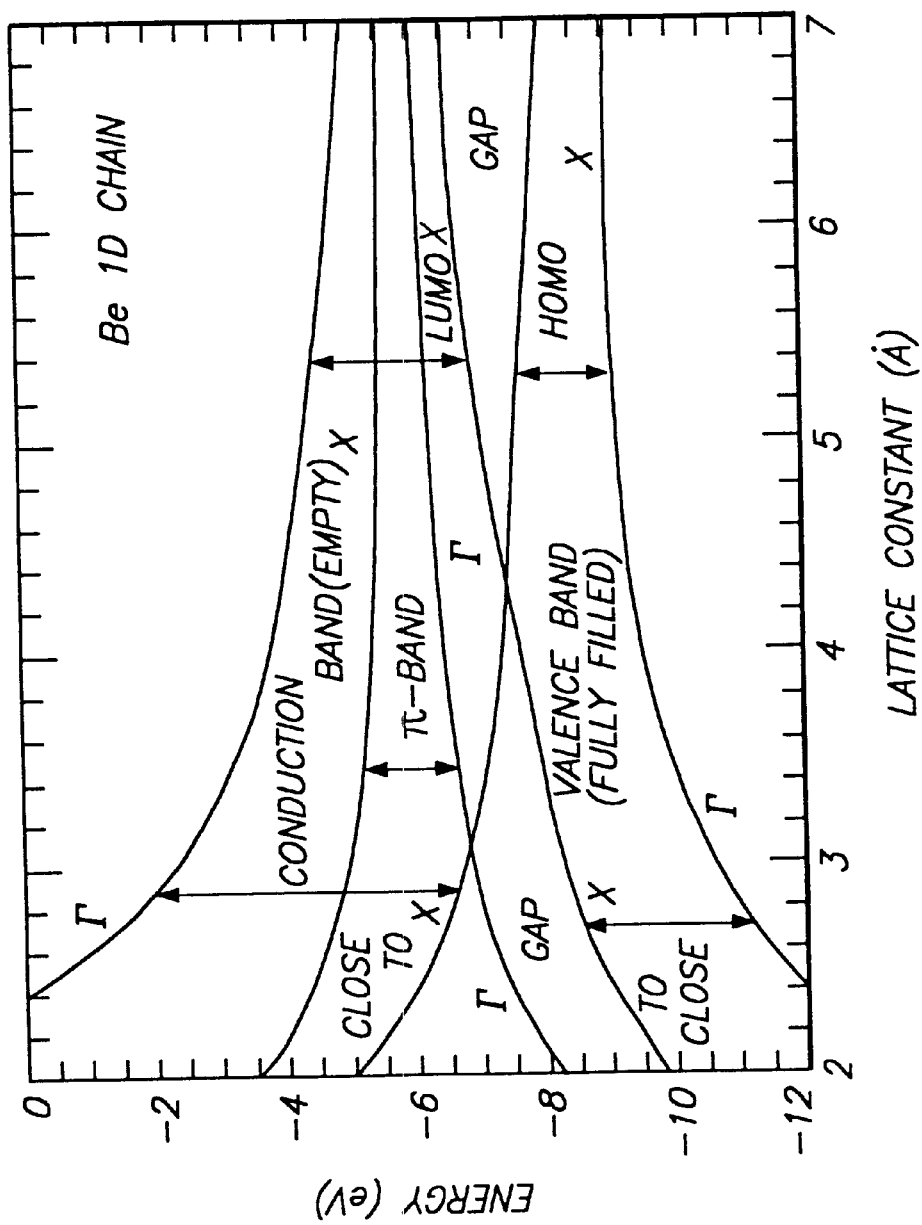
FIG. 12 depicts band structure of a 1D Be chain as a function of lattice constant.
Figures 13A, 13B, 13C:
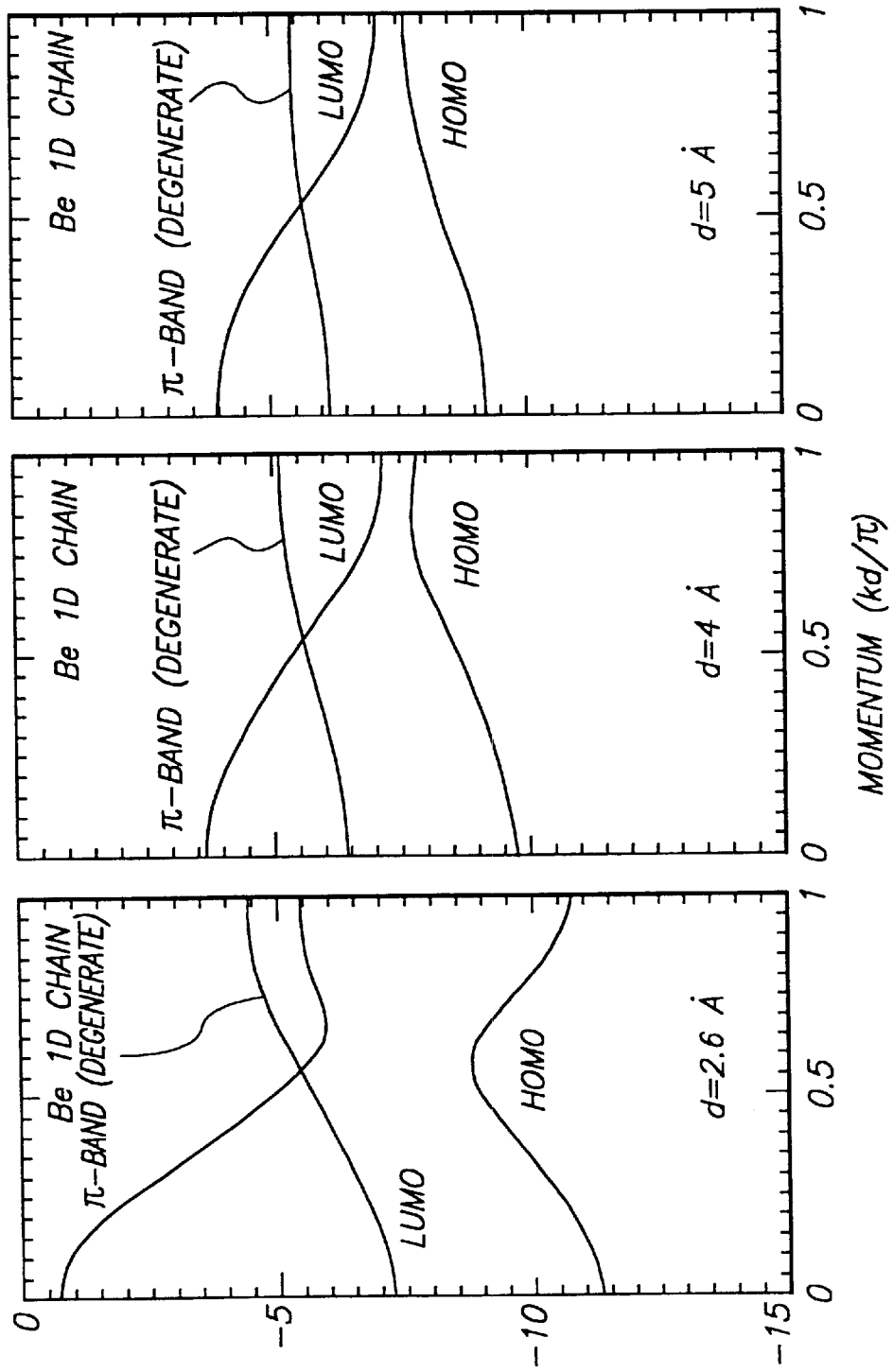
FIGS. 13(a)–(c) depict dispersion (energy-momentum) of a 1D Be chain for lattice constants 2.6 Å, 4 Å and 5 Å.

FIG. 10 shows the band width of a 1D Mg atomic chain as a function of lattice constant d. The band structure is quite similar to that of a 1D Si atomic chain in FIGS. 2 and 3. There are a 3s originated σ-band, a $3p_x$ originated σ-band, and a $3p_y$ or $3p_x$ originated degenerate π-band. All of them are also observed in the 1D Si atomic chain. The only but significant difference is the position of the uppermost electrons in the ground state, in case of the 1D Si atomic chain, the Fermi energy. For an insulator, the Fermi energy is somewhat ill-defined and should be somewhere in the band gap depending on the definition, so we avoid using this concept. The lower band is completely filled and becomes the highest occupied molecular oribital (HOMO), while the upper bands are empty and become the lowest unoccupied molecular orbital (LUMO). The terminology of conduction and valence bands is also used in the figure for this reason. The chain is an insulator having a variable band gap with the lattice constant, and various electronic properties reflect this band gap. The lattice constant of d=4.2 Å is an exceptional point, where the band gap becomes zero and the chain is metallic with a finite density of states of the Fermi energy in the limit. For Be, such a lattice constant d is 4.5 Å, as shown in FIGS. 12 and 13(a)–(c). These 1D atomic chains with divalent atoms are quite attractive since we can change the band gap by manipulating the lattice constant. We encounter an interesting situation since the 1D Mg atomic chain is insulating while the usual 3D Mg crystal with hexagonal close-packed structure is metallic. The difference can be attributed to crossing of the s- and p-bands all small spacing.

B. 2D Mg square array

Figure 14:
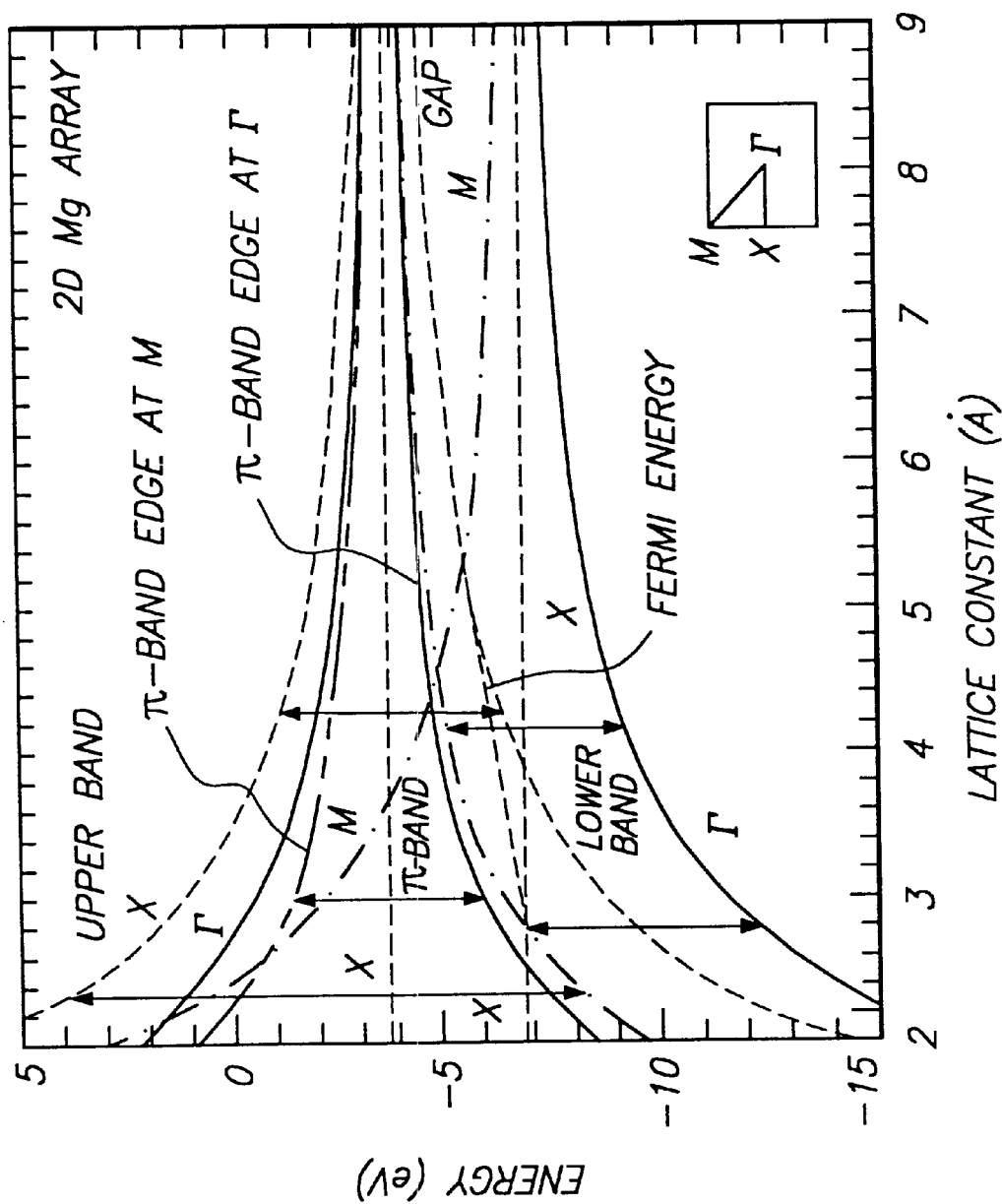
FIG. 14 depicts band structure of a 2D Mg array as a function of lattice constant.
Figure 15:
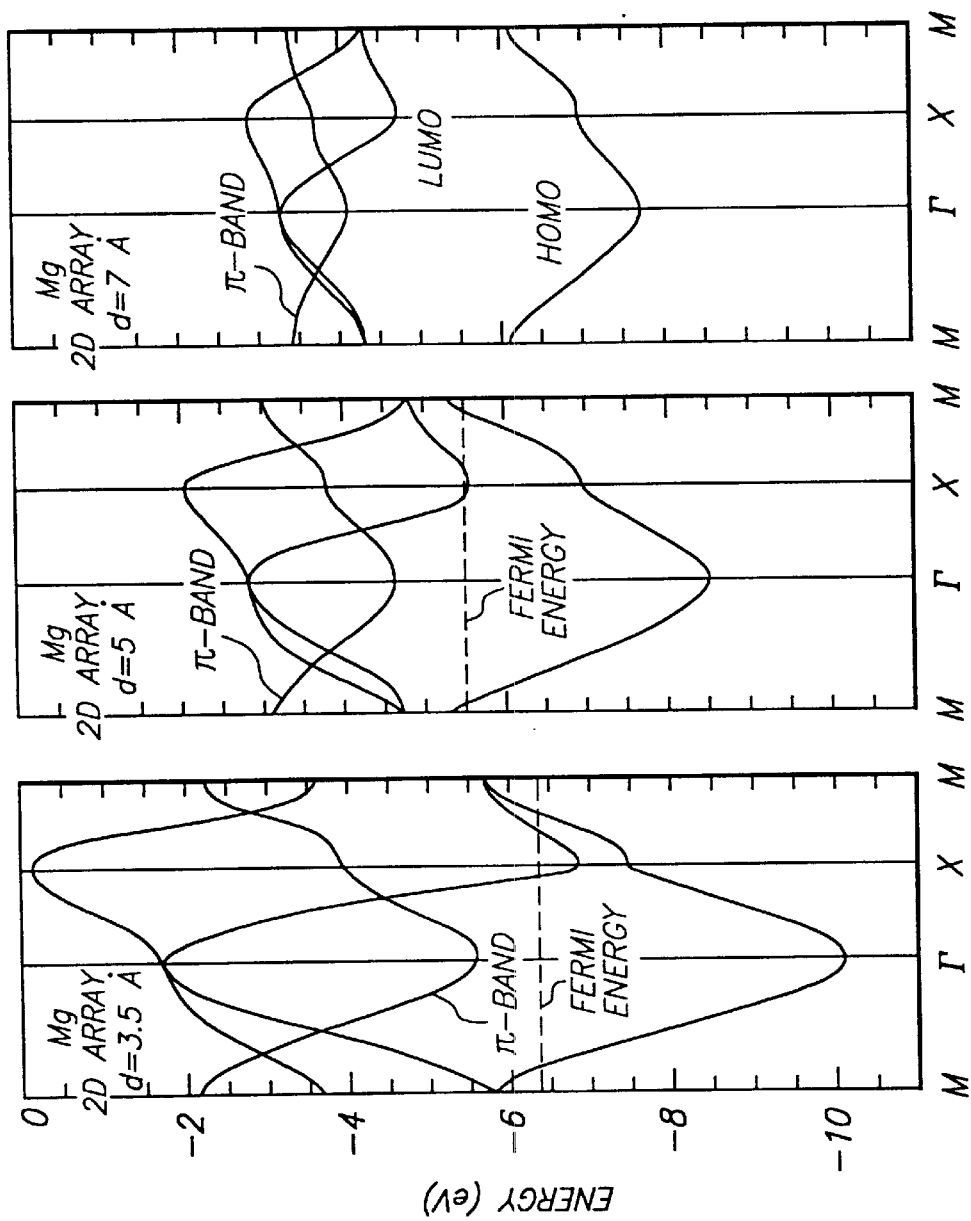
FIGS. 15(a)–(c) depict dispersion (energy-momentum) of a 2D Mg array for lattice constants 3.5 Å, 5 Å and 7 Å.

FIG. 14 shows the band width as a function of lattice constant d. For clarity, energies Γ (solid line), M (dashed-and-dotted line), and X (broken line) are drawn as a function of the lattice constant and the band edges are shown with thick lines. The qualitative properties of the band are quite similar to that of 2D Si square array shown in FIGS. 4 and 5, and again the only but significant difference is the position of the Fermi energy. There are metallic and insulator regions with respect to the lattice constant. For the insulator region of d>5.2 Å, the electrons are filled up to the top of the lower band to form HOMO and LUMO in the presence of the band gap. For the metallic region of 2.8 Å<d<5.2 Å, the Fermi energy shows a monotonical decrease as indicated with a dotted line, and for d<2.8 Å, the Fermi energy coincides one of the energy lines for M. The band gap opens for d>5.2 Å, and disappears for d<5.2 Å: the upper and lower bands overlap for 2.8 Å<d<5.2 Å, and the bottom of the upper bands and the top of the lower band coincide for d<2.8 Å. This atomic structure therefore undergoes a phase transition: the insulating phase for d>5.2 Å and the metallic phase for d<5.2 Å. This situation is clearly shown in FIGS. 15(a)–(c), the dispersion plot for selected lattice constants. 2D Mg square arrays are useful in that they show the metal-insulator transition by manipulating the lattice constant, and may be an important component for electrons applications using one kind atoms. It is interesting to see that this 2D Mg square lattice shows intermediate characteristics between the insulating 1D Mg chain and the usual metallic 3D Mg crystal.

6. Application Onto a Platform

In order to position the individual the individual atoms, a platform is prepared. A substrate is used and an insulator applied thereover. In one aspect of the invention, atoms constituting the chain are not attached chemically to the substrate surface atoms by formation of covalent bonds, but are attached physically. These requirements can be satisfied with careful choice and proper process of the substrate surface. One possibility is to use an insulating Si substrate with uppermost surface atoms being terminated by other appropriate atoms, such as H, so that the unsatisfied bonds of surface atoms are neutralized. Another possibility is to use a reconstructed substrate, where unsatisfied bonds satisfy one another to create an insulated surface. Still another possibility is to use a molecular substrate that does not have unsatisfied bonds at the surface, for example, a tetrahedral molecular crystal. In any case, a good surface for atomic placement is one with a periodic lattice structure.

Figure 16:
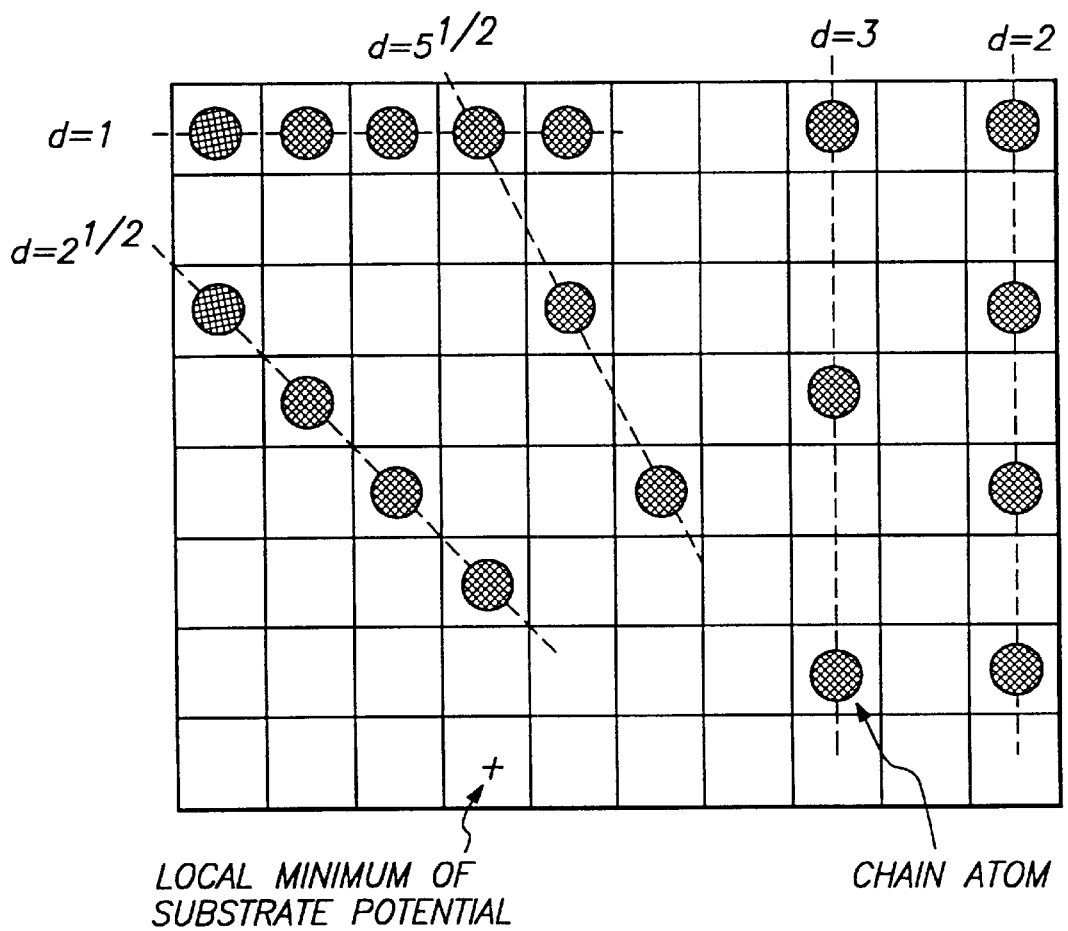
FIG. 16 shows atomic chain arranged in various directions with respect to square lattice potential.

Once the substrate with its surface crystal direction is determined, atoms can be arranged in various directions, which would give different lattice constant values. For example, if the substrate potential realizes a two-dimensional square lattice, it is possible to arrange atoms at integer-multiples of basis vectors (with unity lattice period) such as (i) (1,0), (ii) (1,1), or (iii) (2,1), etc., where the lattice constant is (i) 1, (ii) √2, or (iii) √5, etc., respectively. It is also possible to arrange atoms at integer-multiples of basis vectors (2,0) or (3,0), where the lattice constant is 2 and 3 respectively. By this way, various discrete values of the lattice constant on the given substrate can be realized. Some schematic examples are shown in FIG. 16. Complications may arise if the surface reconstruction is relevant.

In another aspect of the invention, atoms constituting the chain are chemically bonded to the substrate surface atoms by formation of covalent bonds. The insulated surface is manipulated with an STM to remove atoms at predetermined locations. Atom removal provides sites for depositing atoms at the predetermined locations to form the atomic circuit. In some cases, the deposited atoms will form a bond with the underlying substrate and lock in position at the predetermined location. For example, the substrate is sapphire and the insulated surface is H atoms. An STM is used to selectively remove H atoms at predetermined locations and then the STM is used to deposit Mg atoms where the H atoms were removed. The Mg atoms form a bond with the substrate and will not move around on the surface. That is, the surface atom to substrate bond exceeds the surface atom to surface atom bond and the deposited atoms will stay at the predetermined where they are deposited. Of course, atoms deposited on the insulated platform can be combined in a network with atoms deposited at locations where the insulating layer is removed.

Atomic structures have to be created on a substrate making use of the substrate potential, although the above band calculations are performed for an ideal situation so that all the effects from the substrate are negligible, as if the structures were floating in the vacuum. An Si substrate could be available for this purpose, but in one aspect of the invention, we passivate the dangling bonds of the surface atoms since they would otherwise create chemical bonds with the atomic structures. One possibility is to terminate such dangling bonds with H atoms. After successful termination, all the dangling bonds are saturated and the atoms in interest are arranged at potential minima determined by the Van der Waals interaction, without creating any chemical bonds with the substrate atoms. The arranged atoms, adatoms, are subject to the thermal diffusion on the surface, and therefore, low temperature environment is preferred. This confinement potential acting on an adatom generally depends on the combination of adatom and substrate material, and we need to seek that the most suitable material as well as the crystal orientation of the substrate surface for a given adatom to achieve effective confinement at the bottom of the potential wall.

There are conventionally optical and electrical characterization techniques to distinguish metal from insulator. The former characterization will be promising in the future since a near-field optical microscope towards the atomic size is being developed. Currently, the spot size is on the order of 500 Å in diameter, which covers about one hundred atoms in a 1D chain or ten thousand atoms in a 2D array system. Since all the predicted characteristics above are for infinitely long (1D) or large (2D) atomic structures, we need to use as many atoms as possible in experiments. For this reason, the present spot size is approaching an appropriate one. Detecting signals from the atomic structure without having unwanted response from the bulk substrate is not trivial. We should choose a substrate material with a band gap as large as possible so that no states in the substrate are excited by the input light during the measurement, although there would still be a significant unwanted. One possibility to overcome this problem is to detect the second harmonic generation (SHG), or the generation of the sum frequency light from the two input lights (SFG). The significant advantage of this measurement is that SHG/SFG does not occur in the substrate, due to the presence of space inversion symmetry, and can occur only at the surface, when we intentionally arrange atoms so that the inversion symmetry is present. Thus, we can detect the surface atomic structure only, avoiding the unwanted response from the substrate by making use of the nature of the SHG/SFG process.

Electrical characterization is not easy since there is no obvious way to obtain ground with the substrate. Even if the atomic structure makes chemical bonds with surface atoms of the substrate, there will generally be a potential barrier at the junction where two different materials meet. Such junctions usually exhibit nonlinear I–V characteristics, and this hinders the ohmic behavior. Moreover, there is no simple way to place electrical leads to the atomic structure. Such being the case, we can compare the STM images or more generally the I–V characteristics of ungrounded atomic structures in metallic and insulating phases for characterization. If the structures are grounded to the substrate in an ideal manner, it is quite possible to image HOMO and LUMO in the insulating phase for different applied voltages, where the voltage difference corresponds to the band gap, as was previously reported for molecules on a conducting substrate. However, we may still expect that the STM images or I–V characteristics of metallic and insulating atomic structures are different even though they are ungrounded, i.e., electrically isolated from the bulk substrate. Given a properly-doped, hydrogen-terminated Si substrate, e.g., the STM tunneling current and the applied voltage represent the I–V characteristics for doped semiconductor (substrate)—dielectric insulator (hydrogen)—metal (atomic structure)—vacuum—metal (STM tip) for the metallic case, and doped semiconductor (substrate)—dielectric insulator (hydrogen)—dielectric insulator (atomic structure)—vacuum—metal (STM top) for the insulating case, in a simplified picture similar to that shown in P. Sautet, "Calculation of the Benzene on Rhodium STM Image," Chem. Phys. Lett., vol. 185, p. 23 (1991). Electrons will wee a double barrier structure for the metallic case and a single barrier structure for the insulating case, respectively. This crude simplification is not suitable for detailed qualitative studies, but is enough for us to expect that the I–V characteristics will show some difference that will distinguish the metallic and insulating places. There is no need to install the current or voltage leads, unlike the usual conductance measurement, and this simplicity is experimentally quite appealing. Related to the electrical characterization, it is also interesting to check experimentally whether the conductance is quantized in these atomic structures in the metallic phase as in the case of mesoscopic systems.

7. Example of Various Atomic Chain Networks

FIG. 16 shows atomic chain arranged in various directions with respect to square lattice potential as described above. Atoms can be positioned on the lattice to achieve a variety of difference spacings d that are described below.

Figure 17:
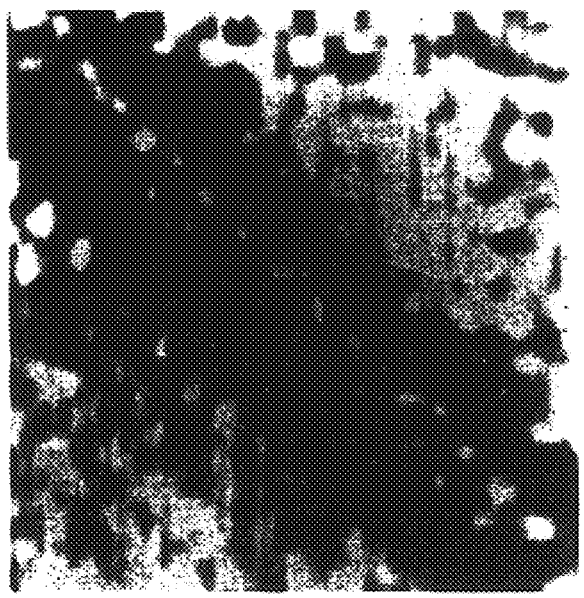
FIG. 17 is an STM photograph of an atomic chain constructed on an Si (111) lattice substrate created by extracting atoms with an STM tip, demonstrating the technology to manipulate atoms one by one.

FIG. 17 is a photograph of an Si atomic chain fabricated on an Si substrate, where the chain was defined by extracting Si atoms from the (111) Si substrate one by one along a line with a scanning tunneling microscope in the ultrahigh vacuum environment (the picture after Aono Atomic Craft Project, Research Development Corporation of Japan). In this preliminary example, the absence of atoms defined an atomic chain, unlike the following discussions where the presence of atoms forms the chain. It is emphasized, however, that this result demonstrates the ability to fabricate such atomic chain structures by manipulating atoms one by one. This leads to the concept of one-dimensional array of atoms, or atomic chain, where chain atoms couple with each other but are isolated from the substrate so that electron motion is restricted only in the chain. The substrate provides a potential by which an atomic chain can be formed. With changing a lattice constant, the band structure and the Fermi energy can be controllable.

Figure 18:
FIG. 18 is an STM photograph of H terminated Si (100) lattice substrate, where the bright spots correspond to locations where H atoms are intentionally removed after the Si surface is uniformly terminated with H atoms.

FIG. 18 is an STM photograph of H terminated Si (100) lattice substrate, where the bright spots correspond to locations where H atoms are intentionally removed after the Si surface is uniformly terminated with H atoms. This lattice substrate structure is an example of the type of structure that can be used in the embodiments described in the invention. The following examples can be constructed, for example, on the lattice substrate shown in FIG. 18.

FIGS. 19(a)–(e) show schematically an atomic chain of such an Mg atoms fabricated on an insulator substrate such as sapphire whose dangling bonds at the surface are properly saturated, where the lattice constant is determined by the crystal direction of the substrate surface, together with what kind of chain atoms and substrate materials are used. Generally, the conductor state is realized for a specific lattice constant of 4.2 Å and the insulator state is realized for either small or larger lattice constants as shown in FIG. 10. Generally, the insulator state is realized for a lattice constant greater than or less than approximately 4.2 Å and the conductor state is realized for a lattice constant approximately equal 4.2 Å, as described above with reference to FIG. 10.

Figure 19A:
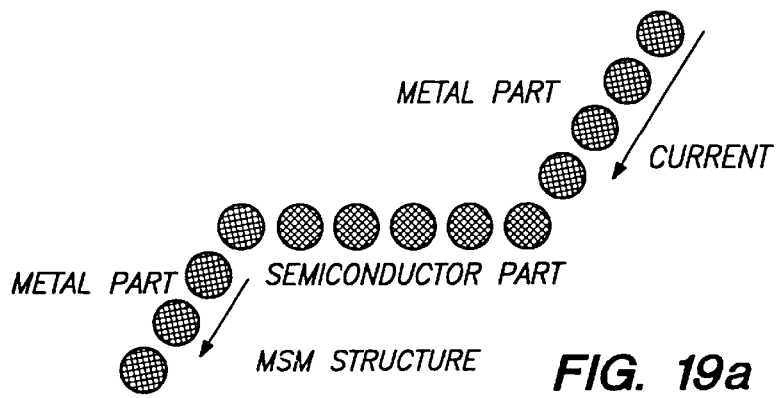
FIGS. 19(a)–(e) show various networks formed by atomic chains constructed according to the present invention.
Figure 19B:
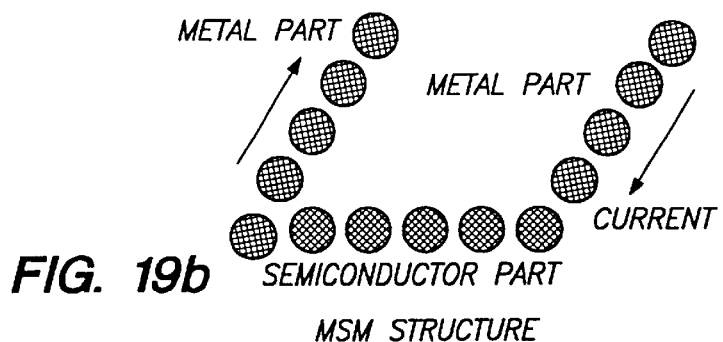
Figure 19C:
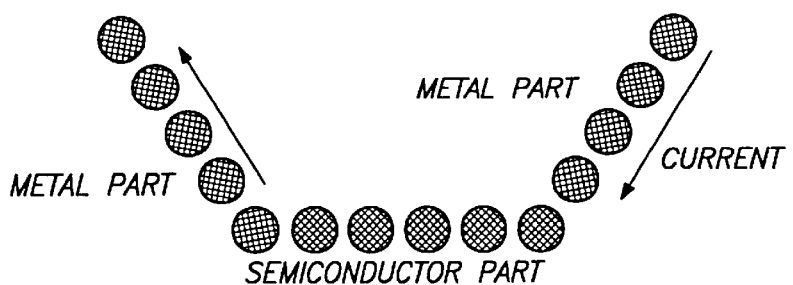
Figure 19D:
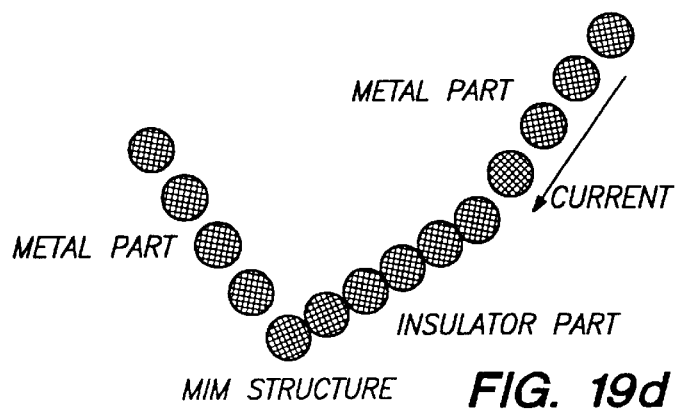

Since the substrate potential has a different potential period for different crystal directions with respect to the substrate surface, the direction of the atomic chain uniquely determines the electrical state of the chain, which can be metal, semiconductor, or insulator. It is then possible to create a circuit network by connecting atomic chains in various directions on the substrate surface. FIG. 19(a) shows a structure where metal atomic chains and a semiconductor/insulator atomic chain are connected in series, and FIG. 19(b) another possible structure where a pair of metal chains are placed in parallel at the same side of the semiconductor chain, and both ends of the semiconductor chain are connected at the both ends of metal chains. The width of the semiconductor can be changed by changing the separation of the two parallel atomic chain in both structures. FIG. 19(c) shows a further possible metal-semiconductor-metal (MSM) structure and FIG. 19(d) a metal-insulator-metal (MIM) structure by utilizing the directional dependence of the substrate potential period. It is often the case that the direction is not unique to obtain a certain state, which can be metal, semiconductor or insulator. Then such multiple directions are used to form a structure as shown in FIG. 19(d). The Schottkey junction can be created similarly. The same policy can be applied to a p-n junction. These junctions are used electrically or optically, the latter of which will be discussed in connection with solar cells and light emitting diode. Also, while the I–V relationships for these junctions is not yet fully characterized, a non-linear relationship is expected, as in analogous to the macroscopic case.

Figure 19E:
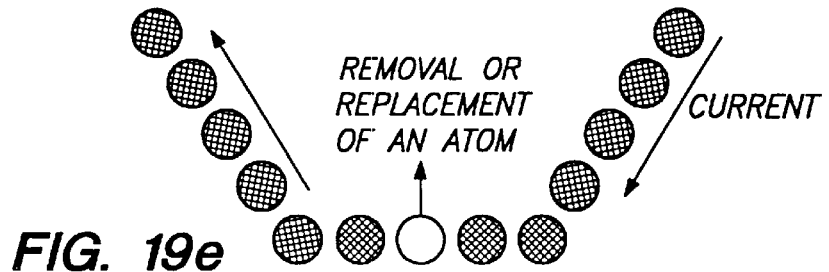

FIG. 19(e) shows an atomic switch or a gate by removing an atom from the atomic chain. The translational symmetry of the potential along the chain is broken here at the defect. This type of defect causes the depletion of carriers, where the electron wave function has a small amplitude. We may replace an atom with a different kind of atom, instead of removing it, as shown in FIG. 19(e). In this case, carriers will be either depleted or accumulated depending on the relative ordering of term values $\epsilon_s$ and $\epsilon_p$ with respect to those of the chain atoms.

Figure 20A:
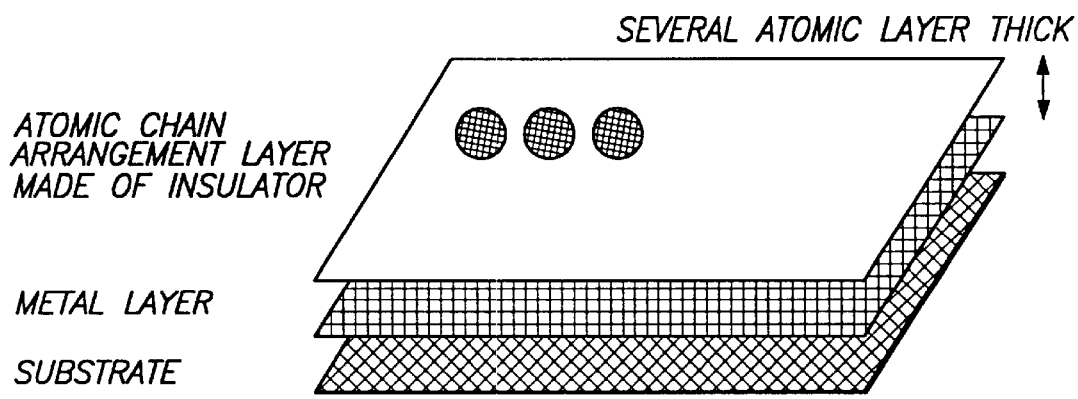
FIGS. 20(a)–(d) show various network configurations formed by various substrate and atomic chains constructed according to the present invention.
Figure 20B:
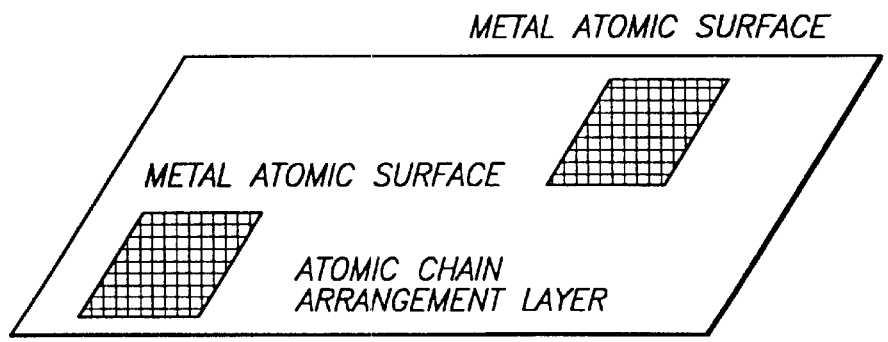

Ground is important in practical circuit applications and is fabricated by growing a macroscopic metal layer at the back surface of the substrate traditionally. However, since the substrate is much thicker compared with the atomic-scale and it is not trivial to connect the atomic chain with the ground at the back surface, one way to accomplish the ground layer is to construct a metal layer on the top of the substrate surface, and then grow an insulator layer with the thickness of several atoms, as indicated in FIG. 20(a). In this case, it is expected that a carrier in the atomic chain will induce an image charge in the metal across the insulator layer, and they are bounded through the Coulomb interaction. Because of this, the transport properties of the carrier along the atomic chain is modified. Or, another way to obtain ground is to create a two-dimensional array of atoms with a lattice constant realizing a metallic state, which is called as a metal atomic surface here, and use it as ground as shown in FIG. 20(b).

Figure 20C:
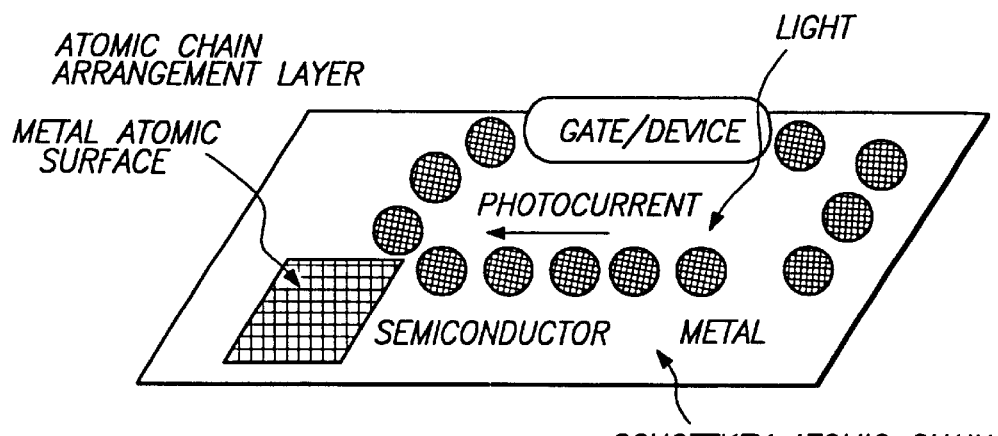

It is necessary to establish a method to apply voltage to the circuit elements. An atomic-scale solar cell is made of a Schottkey junction with a metal chain and a p-semiconductor chain if the p-semiconductor atomic chain is successfully prepared, where light is applied at the junction as shown in FIG. 20(c). The adoption of such spatially nonuniform structure is beneficial in order to maintain a steady current flow, just like the case of macroscopic molar cells. This atomic-scale solar cell is ideal for circuit network with atomic chains since (1) the atomic chain has a direct band gap due to the dimensionality of the system and there would be an efficient interaction with light, and (2) the connection of the battery (the present atomic-scale solar cell) to the atomic chain devices does not cause any trouble due to their same scale. The solar cell is also possible by using a p-n junction. The Schottkey junction can also serve as a light emitting diode under the forward bias condition, in analogy with the macroscopic case, where the electron-hole radiative recombination process is realized. Because of the dimensionality of the system, the band gap is direct and the efficiency for light transformation of electric energy is expected to be high. The light emission is again possible with p-n junction.

Figure 20D:
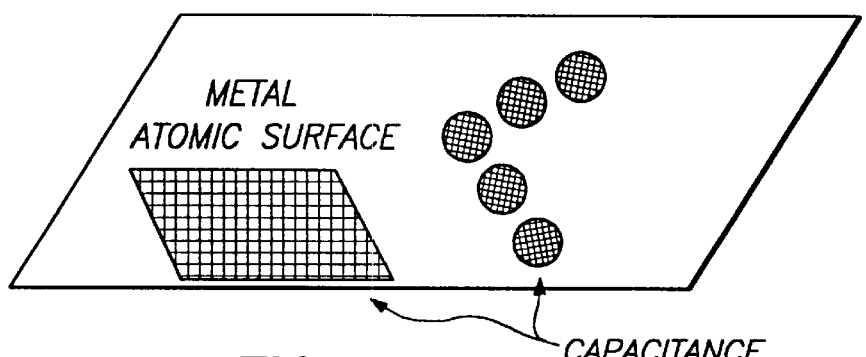

FIG. 20(d) shows a method to obtain a floating capacitance, where a metal atomic surface is created close to a metal atomic chain. The capacitance value is determined by the geometry an the constituent atoms. Such capacitance can be used, for example, to create a device with the Coulomb blockade effect where an extremely small capacitance value (the charged capacitance energy is much larger than the thermal energy) is necessary.

Figure 21:
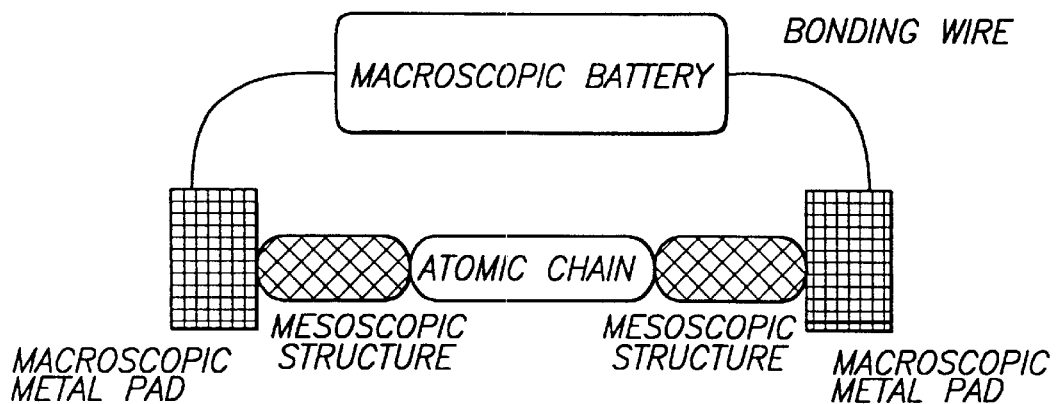
FIG. 21 shows an atomic chain network coupled to a mesoscopic structure and macroscopic structure to interface with a battery.

FIG. 21 shows an example to connect an atomic chain with a macroscopic system such as an external battery, which is complex when the battery macroscopic and the atomic chain is microscopic. The atomic chain is connected to the battery pads via mesoscopic systems. Once the chain is connected to the macroscopic battery pads, it is easy to connect to the battery with bonding wire.

If the same chain and substrate structure is repeated more than twice in the vertical direction, we can save area and such configuration is advantageous for future integration.

Embodiments described here can be constructed and linked together with same or different types of atoms. For example, since Si is found to be metallic for most circumstances, it may be beneficial to couple chains of Si to other more semiconductive atoms such as Mg and Be to form atomic chain circuit networks that behave much in the same way at contemporary integrated circuits with aluminum conductors coupling Si-based semiconductors.

Having disclosed a preferred embodiment and the best mode, modifications and variations may be made to the disclosed embodiments while remaining within the scope of the present invention as defined by the claims.

What is claimed is:

1. A method of making an atomic chain circuit on a platform comprising the steps of:

placing atoms at predetermined locations on the platform to form chains of atoms electrically coupling to one another where each chain behaves as one of a conductor, semiconductor and insulator based at least in part on an atomic spacing between the atoms of each chain.

2. The method of claim 1, wherein the platform includes a substrate and an insulating layer, and wherein:

said placing step is preceded with a step of removing atoms from the insulating layer at predetermined locations to prepare the platform for said placing step; and said placing step includes placing each atom at predetermined locations wherein each atom has a bond with the substrate.

3. The method of claim 2, wherein the platform includes a lattice oriented substrate and an insulating layer, said method further comprising the steps of:

forming the substrate with a plurality of lattice oriented atoms to create a substantially planar surface having a lattice arrangement; and terminating any unsatisfied chemical bonds from the substrate along the substantially planar surface by placing atoms at the site of the unsatisfied chemical bonds to terminate the unsatisfied chemical bonds and insulate the surface to form the insulating layer.

4. The method of claim 1, wherein:

said placing steps are performed with group IIA element atoms.

5. The method of claim 1, wherein:

said placing steps are performed with Mg atoms.

6. The method of claim 1, wherein:

said placing steps are performed with Be atoms.

7. The method of claim 1, wherein:

said placing steps are performed with a combination of Ga and As atoms.

8. The method of claim 5, wherein:

said placing steps are performed by spacing the predetermined locations at greater than or less than approximately 4.2 Å for an insulator and spacing the predetermined locations at approximately 4.2 Å for a conductor.

9. The method of claim 1, wherein:

said placing steps are performed with group IVA element atoms.

10. The method of claim 1, wherein:

said placing steps are performed with Si atoms.

11. A method of making an atomic chain circuit on a platform having crystallographic directions comprising the steps of:

placing atoms at locations according to the crystallographic directions on the platform to form chains of atoms electrically coupled to one another where each chain behaves as one of a conductor, semiconductor and insulator based at least in part on an atomic spacing between the atoms of each chain;

wherein said placing step is preceded with a step of removing atoms from the insulating layer at locations to prepare the platform for said placing step; and wherein said placing step includes placing each atom at locations where each atom has a bond with the substrate.

12. The method of claim 11, wherein the platform includes a lattice oriented substrate and an insulating layer, said method further comprising the steps of:

forming the substrate with a plurality of lattice oriented atoms to create a substantially planar surface having a lattice arrangement; and terminating any unsatisfied chemical bonds from the substrate along the substantially planar surface by placing atoms at the site of the unsatisfied chemical bonds to terminate the unsatisfied chemical bonds and insulate the surface to form the insulating layer.

13. A method of making an atomic chain circuit on a platform having crystallographic directions comprising the steps of:

placing atoms at locations according to the crystallographic directions on the platform to form chains of atoms electrically coupled to one another where each chain behaves as one of a conductor, semiconductor and insulator based at least in part on an atomic spacing between the atoms of each chain; and wherein said placing steps are performed with group IIA element atoms.

14. A method of making an atomic chain circuit on a platform having crystallographic directions comprising the steps of:

placing atoms at locations according to the crystallographic directions on the platform to form chains of atoms electrically coupled to one another where each chain behaves as one of a conductor, semiconductor and insulator based at least in part on an atomic spacing between the atoms of each chain; and wherein said placing steps are performed with group IVA element atoms.

15. A method of making an atomic array circuit on a platform comprising the steps of:

placing atoms at predetermined locations on the platform to form arrays of atoms electrically coupled to one another where each array behaves as one of a conductor, semiconductor and insulator based at least in part on an atomic spacing between the atoms of each array.

16. The method of claim 15, wherein the platform includes a substrate and an insulating layer, and wherein:

said placing step is preceded with a step of removing atoms from the insulating layer at predetermined locations to prepare the platform for said placing step; and said placing step includes placing each atom at predetermined locations wherein each atom has a bond with the substrate.

17. The method of claim 16, wherein the platform includes a lattice oriented substrate and an insulating layer, said method further comprising the steps of:

forming the substrate with a plurality of lattice oriented atoms to create a substantially planar surface having a lattice arrangement; and terminating any unsatisfied chemical bonds from the substrate along the substantially planar surface by placing atoms at the site of the unsatisfied chemical bonds to terminate the unsatisfied chemical bonds and insulate the surface to form the insulating layer.

18. The method of claim 15, wherein:

said placing steps are performed with group IIA element atoms.

19. The method of claim 15, wherein:

said placing steps are performed with group IVA element atoms.

20. The method of claim 18, wherein:

said placing steps are performed by spacing the predetermined locations at greater than approximately 5.2 Å for an insulator and spacing the predetermined locations at less than approximately 5.2 Å for a conductor.

21. An atomic chain circuit made according to the method of claim 1.

22. An atomic chain circuit made according to the method of claim 12.

23. An atomic array made according to the method of claim 15.

* * * * *